(12) United States Patent
Fujisawa et al.

(10) Patent No.: US 6,433,418 B1
(45) Date of Patent: Aug. 13, 2002

(54) APPARATUS FOR A VERTICALLY ACCUMULABLE SEMICONDUCTOR DEVICE WITH EXTERNAL LEADS SECURED BY A POSITIONING MECHANISM

(75) Inventors: Tetsuya Fujisawa; Mitsutaka Sato; Seiichi Orimo, all of Kawasaki; Kazuhiko Mitobe, Niigata; Masaaki Seki, Kawasaki; Masaki Waki, Kagoshima; Toshio Hamano, Kawasaki; Katsuhiro Hayashida, Sasebo; Yoshitsugu Katoh; Hiroshi Inoue, both of Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/301,345

(22) Filed: Apr. 29, 1999

(30) Foreign Application Priority Data

Jul. 24, 1998 (JP) ............................................. 10-209732

(51) Int. Cl.[7] ........................ H01L 23/02; H01L 23/48; H01L 23/50; H01L 27/10; H01L 23/495
(52) U.S. Cl. ........................ 257/696; 257/684; 257/666; 257/698; 257/693; 257/692; 257/690; 257/796; 257/686; 257/685; 257/723; 257/797; 257/777; 257/673; 257/788; 257/730; 257/787
(58) Field of Search .................................. 257/685, 730, 257/686, 696, 698, 666, 693, 692, 690, 773, 784, 777, 776, 788, 669, 672, 674, 676, 667, 684, 787, 786, 673

(56) References Cited

U.S. PATENT DOCUMENTS

| | | | |
|---|---|---|---|
| 4,724,280 A | 2/1988 | Tsuji et al. | ............... 174/52 FP |
| 4,794,446 A | 12/1988 | Hammo | |
| 4,945,398 A | * | 7/1990 | Kurita et al. |
| 5,198,886 A | * | 3/1993 | Verspeek et al. ........... 257/727 |
| 5,224,021 A | 6/1993 | Takada et al. | ............... 257/696 |
| 5,349,501 A | 9/1994 | Kawakami | ................... 257/692 |
| 5,446,623 A | 8/1995 | Kanetake | ..................... 257/692 |

(List continued on next page.)

FOREIGN PATENT DOCUMENTS

| | | |
|---|---|---|
| JP | 64-41252 | 2/1989 |
| JP | 2-89355 | 3/1990 |
| JP | 2-163957 | 6/1990 |
| JP | 2-181960 | 7/1990 |
| JP | 3-280566 | 12/1991 |
| JP | 3-283456 | 12/1991 |
| JP | 4-144264 | 5/1992 |
| JP | 6-334099 | 12/1994 |
| JP | 6-350015 | 12/1994 |
| JP | 7-263609 | 10/1995 |
| JP | 8-8389 | 1/1996 |
| JP | 8-148635 | 6/1996 |
| JP | 08148635 | 6/1996 |

*Primary Examiner*—Alexander O. Williams
(74) *Attorney, Agent, or Firm*—Armstrong, Westerman & Hattori, LLP

(57) ABSTRACT

A semiconductor device includes a resin package in which a semiconductor chip is sealed, the resin package having a first surface and a second surface opposite to the first surface; a plurality of leads having inner lead parts connected to the semiconductor chip and outer lead parts extending outside the resin package, the outer lead parts being bent along the shape of the resin package so as to form first terminal parts on the second surface and second terminal parts on the first surface; connection means electrically connecting the semiconductor chip and the leads; and a positioning mechanism provided either on the leads or on the resin package, which positions the outer lead parts by engaging a part of the outer lead parts to the resin package. Further, at least one of the leads and/or connection means is cut so as to electrically disconnect the semiconductor chip and the one of the leads and/or connection elements.

4 Claims, 26 Drawing Sheets

U.S. PATENT DOCUMENTS

| | | | | |
|---|---|---|---|---|
| 5,451,716 A | * | 9/1995 | Hasegawa etal. | 361/743 |
| 5,466,887 A | * | 11/1995 | Hasegawa | 174/52.2 |
| 5,554,886 A | * | 9/1996 | Song | 257/666 |
| 5,706,177 A | | 1/1998 | Nather et al. | 257/693 |
| 5,714,405 A | * | 2/1998 | Tsubosuki et al. | |
| 5,793,099 A | * | 8/1998 | Murakami et al. | 257/666 |
| 5,801,439 A | * | 9/1998 | Fujisawa et al. | 257/686 |
| 5,818,107 A | | 10/1998 | Pierson et al. | 257/723 |
| 5,821,615 A | | 10/1998 | Lee | 257/686 |
| 5,835,988 A | | 11/1998 | Ishii | 257/684 |
| 5,877,561 A | * | 3/1999 | Kim | 257/796 |
| 5,986,209 A | * | 11/1999 | Tandy | 257/686 |
| 6,002,167 A | * | 12/1999 | Hatano et al. | 257/696 |
| 6,066,514 A | * | 5/2000 | King et al. | 438/118 |
| 6,104,086 A | * | 8/2000 | Ichikawa et al. | 257/690 |
| 6,111,312 A | * | 8/2000 | Hirumuta et al. | 257/696 |

\* cited by examiner

10A

10A

APPARATUS FOR A VERTICALLY ACCUMULABLE SEMICONDUCTOR DEVICE WITH EXTERNAL LEADS SECURED BY A POSITIONING MECHANISM

BACKGROUND OF THE INVENTION

1. Field of the Invention

The present invention generally relates to a semiconductor device, a semiconductor device unit and a method of manufacturing a semiconductor device unit, and particularly relates to a semiconductor device, a semiconductor device unit and a method of manufacturing a semiconductor device unit which provides high-density mounting by stacking the semiconductor devices.

A semiconductor device is required to be further miniaturized, to achieve higher operational speed and to be more sophisticated, so as to meet the trend of recent electronic devices. The efficiency in mounting the semiconductor device on a mounting board also needs to be improved.

To achieve the above requirements, a majority of semiconductor devices currently available is of the surface-mounting type in which leads are connected on the surface of the mounting board. Yet, a semiconductor device having higher mounting efficiency is desired.

2. Description of the Related Art

FIG. 1 is a perspective view showing a semiconductor device 1 of the prior art. FIG. 2 is a cross-sectional diagram of the semiconductor device of the prior art taken along a line A—A in FIG. 1. The semiconductor device 1 is disclosed in Japanese Patent Laid-Open Application Nos. 63-15453 and 63-15451.

A semiconductor device 1 shown in FIG. 1 and in FIG. 2 includes a semiconductor chip 2, a resin package 3 for sealing the semiconductor chip 2, leads 4 and a stage 7 on which the semiconductor chip 2 is mounted. Each of the leads 4 has one end connected to the semiconductor chip 2 by a wire 5 and the other end exposed from a bottom surface 3a of the resin package 3 so as to form an external terminal 6. In other words, in semiconductor device 1, all parts of the leads 4 except the external terminals 6 are sealed within the package 3.

In the semiconductor device 1 of the above structure, since the parts forming the external terminals 6 are exposed from the bottom surface 3a of the resin package 3, the amount or length of the leads 4 projecting from the side of the package 3 can be reduced. Because of this, the mounting density of the semiconductor device is increased. Also, in the above structure, it is not necessary to bend the projecting part of the lead and thus a mold utilized for bending is no longer required. Therefore various advantages, for example reduction in the manufacturing cost, are expected.

However, there is a problem in the semiconductor device of the prior art. As shown in FIG. 2, terminals 4a of the leads 4, which are to be connected by wires, are positioned at the side of the semiconductor chip 2. Because of this, the package 3 is large in size, and the semiconductor device 1 can not achieve sufficient miniaturization. Ideally, the size of the semiconductor device is miniaturized so as to be substantially the same as the size of the semiconductor chip. Whereas in the semiconductor device 1 of the prior art, the size of the package 3 is more than twice the size of the semiconductor chip 2.

For a semiconductor device proposed so as to solve the above problem, see Japanese Patent Application No. 4-281951, entitled "Semiconductor Device and Method of Manufacturing Semiconductor Device". FIGS. 3A–3B show a semiconductor device elated to the above Patent Application.

A semiconductor device 10A shown in FIGS. 3A–3B is provided with a semiconductor chip 11, a resin package 17 for sealing this semiconductor chip 11 and a plurality of leads 14. Each of the leads 14 has an inner end 14a electrically connected to the semiconductor chip 11 and an outer end exposed from a bottom surface 17a of a resin package 17 so as to form an external terminal 16. All parts of the leads 14, except the external terminals 16, are sealed within the package 17. The semiconductor device 10A is characterized in that the plurality of the leads 14 is at least partly overlapped with the semiconductor chip 11 vertically within the package 17.

Because of the above structure, the semiconductor device 10A is miniaturized compared to the semiconductor device 1 shown in FIG. 1 and FIG. 2 by an area of the overlapped part (indicated by an arrow L1 in FIG. 3A). Also in FIG. 3A, the semiconductor device 10A includes a stage 12, an electrode pad 13 and wires 15.

In order to achieve further high-density mounting, semiconductors may be mounted in a vertical stack. However, the semiconductor device 10A shown in FIGS. 3A–3B is not suitable for being mounted vertically in a stack. This causes a problem that further high-density mounting (i.e. three-dimensional mounting) cannot be achieved.

For a semiconductor device proposed so as to solve the above problem, see Japanese Patent Application No. 6-168449, entitled "Semiconductor Device and Semiconductor Device Unit". FIGS. 4 and 5 show a semiconductor device related to the above Patent Application.

A semiconductor device 10B shown in FIG. 4 and in FIG. 5 includes leads 18 each of which has an inner lead part 18a and an outer lead part 18b. The semiconductor device is characterized in that a first terminal 18b-1, a second terminal 18b-2 and a third terminal 18b -c are formed by extending the outer lead part 18boutside the resin package 17 and by bending the outer lead part 18b along a shape of the resin package 17.

The semiconductor device 10B has a structure such that the first terminal 18b-1 is placed on the bottom surface of the resin package 17 and the second terminal 18b-2 on the top surface of the resin package 17. Therefore, it is now possible to mount the semiconductor device 10B in a stack thereby achieving further high-density mounting.

However, the semiconductor device 10B shown in FIG. 4 and FIG. 5 is constructed by simply bending the outer lead parts 18b along the shape of the resin package 17 so as to pull the outer lead parts 18b up to the top surface of the resin package 17. Because of this, the second terminal parts 18b-2 and the third terminal parts 18b-3 are provided in such a manner that they are slightly spaced apart from the semiconductor device 10B (see FIG. 5).

Accordingly, the outer lead parts 18b may be easily deformed when an external force is applied. In such a case that neighboring outer lead parts 18b are short-circuited, or that the second terminal parts 18b-2 and the third terminal parts 18b-3 are offset from the predetermined position, electric connection between the upper and the lower semiconductor devices 10B may not be successful. Therefore, there arises a reliability problem in mounting the semiconductor devices in a stack.

In order to solve the above problem, the whole outer lead part 18b may be embedded in the resin package 17. Before being embedded, the outer lead part 18 is bent, for example, by insert-molding. The surface used for electric connection is exposed from the resin package 17. This structure prevents the outer lead part 18b from being unnecessarily displaced from its predetermined position.

However, when the outer lead parts 18b are embedded in the resin package 17, they are not displaced freely within the resin package 17. For example when there is a temperature rise of the device due to the emission of heat by the semiconductor chip 11, a stress is produced at an interface between the leads 18 and the resin package 17. This is caused by the difference in thermal expansion between the leads 18 and the resin package 17.

The coefficient of thermal expansion of the leads 18 is generally larger than the coefficient of thermal expansion of the resin package 18. Accordingly, when there is a temperature rise as described above, the leads 18 will press the resin package 17. Therefore, in the worst case, cracks may be formed in the resin package 17. Also, when these semiconductor devices are stacked using solder, the above described stress may be applied to the part joined by solder and solder may peel off.

Japanese Patent Application No. 10-209732 discloses a semiconductor device unit having-a stack of a plurality of semiconductor devices which can be selectively operated. The semiconductor device described therein is provided with chip-select terminals and chip-select leads. The semiconductor device is selectively operated when chip-select signals are applied to the chip-select terminals. This is achieved by connecting the chip-select terminals and the chip-select leads by means of wires.

However, with the semiconductor device and the semiconductor device unit described above, it is necessary to individually manufacture the semiconductor devices having different structures. This results in a complicated structure and an increased cost. Also, depending on a wire connection structure, some of the semiconductors are only usable as a component of a semiconductor device unit having a stacked structure, which causes a reduced productivity. Moreover, it is necessary to separately handle the semiconductor devices having the different structures before forming a stacked structure. This results in an increased product controlling cost.

Therefore, there is a need for a semiconductor device and a semiconductor device unit which have a simple structure and can be manufactured with a reduced cost.

SUMMARY OF THE INVENTION

According, it is a general object of the present invention to provide a semiconductor device, a semiconductor device unit and a method of manufacturing a semiconductor device unit which can satisfy the needs described above.

It is another and more specific object of the present invention to provide a semiconductor device, a semiconductor device unit and a method of manufacturing a semiconductor device unit which can achieve high-density mounting with high reliability.

In order to achieve the above objects according to the present invention, a semiconductor device includes: a resin package in which a semiconductor chip is sealed, the resin package having a first surface and a second surface opposite to the first surface; a plurality of leads having inner lead parts connected to the semiconductor chip and outer lead parts extending outside the resin package, the outer lead parts being bent along the shape of the resin package so as to form first terminal parts on the second surface and second terminal parts on the first surface; connection means electrically connecting the semiconductor chip and the leads; and a positioning mechanism provided either on the leads or on the resin package, which positioning mechanism positions the outer lead parts by engaging a part of the outer lead parts to the resin package.

In the semiconductor device described above, an electric connection can be made at each of the first surface and the second surface of the resin package.

Therefore, it is possible to vertically stack a plurality of the semiconductor devices, so that the mounting ability of the semiconductor device is improved.

Also, the outer lead parts are positioned by the positioning mechanism which positions the outer lead parts by engaging a part of the outer lead parts. This prevents the outer lead parts from being deformed or short-circuited in a case when an external force is applied to the outer lead parts when assembling or mounting the semiconductor devices.

Moreover, the positioning mechanism operates not by engaging with the entire outer lead parts, but by engaging with a part of the outer lead parts. In other words, the outer lead parts are positioned by the positioning mechanism while being able to be displaced or deformed within the range that deformation or a short circuit will not occur.

Therefore, when there is a difference in the rate of thermal expansion between the leads and the resin package, a stress caused by heating can be released by displacement or deformation of the outer lead parts. Accordingly, cracking of the resin package or peeling of the solder at a mounting position can be positively prevented, thereby improving the reliability of the semiconductor device.

It is yet another object of the invention to provide a semiconductor device which can prevent the outer lead parts from being deformed or short-circuited and can also be employed in a case when the lead pitch is narrowed.

In order to achieve the above object, a semiconductor device includes a resin package in which a semiconductor chip is sealed, the resin package having a first surface and a second surface opposite to the first surface; leads having inner lead parts connected to the semiconductor chip and outer lead parts extending outside the resin package from the second surface, the outer lead parts being bent along the shape of the resin package so as to form first terminal parts on the second surface and second terminal parts on the first surface; connection means electrically connecting the semiconductor chip and the leads; and protrusions formed at four corners of the resin package, the protrusions having a height higher than a surface of the resin package and lower than a thickness of the outer lead parts.

In the semiconductor device described above, an electrical connection can be made at each of the top surfaces and the side surfaces of the resin package.

Therefore, it is possible to vertically stack a plurality of the semiconductor devices, so that the mounting ability of the semiconductor device is improved.

Also, the protrusions will accept the external force applied from the side surface, thereby preventing the outer lead parts from being deformed or short-circuited.

Further, there is no need for forming grooves corresponding to each of the outer lead parts. Therefore, the semiconductor device can also be employed in a case when the semiconductor chips are mounted with high density, that is to say, when the number of the leads is increased and the lead pitch is narrowed.

It is yet another object of the invention to easily form a stack of semiconductor devices and mprove the mounting density of the semiconductor device.

In order to achieve the above object, a semiconductor device unit has a structure in which a plurality of semiconductor devices as described above are stacked in a vertical direction. In this structure, outer lead parts positioned at the first surface of an upper one of the semiconductor devices and outer lead parts positioned at the second surface of a lower one of the semiconductor devices are electrically connected, so as to enable the vertical mounting of a plurality of the semiconductor devices.

It is yet another object of the invention to provide joining material and to join the semiconductor devices more easily compared to the structure in which the joining material is provided after the semiconductor devices are stacked.

In order to achieve the above object, a method of manufacturing a semiconductor device unit having a structure in which a plurality of semiconductor devices, as described above, are stacked in a vertical direction, includes the steps of:

a) providing joining material at parts serving as external connection terminals of the semiconductor device;

b) stacking a plurality of the semiconductor devices which are provided with the joining material; and c) electrically and mechanically joining neighboring ones of the semiconductor devices using the joining material by implementing heat treatment on a plurality of the stacked semiconductors.

Other objects and further features of the present invention will be apparent from the following detailed description when read in conjunction with the accompanying drawings.

BRIEF DESCRIPTION OF THE DRAWINGS

FIGS. 15A–5C are schematic diagrams showing the method of manufacturing the first embodiment of the semiconductor device unit of the present invention.

DESCRIPTION OF THE PREFERRED EMBODIMENTS

In the following, a principle and an embodiment of the present invention will be described with reference to the accompanying drawings.

Figure 1:
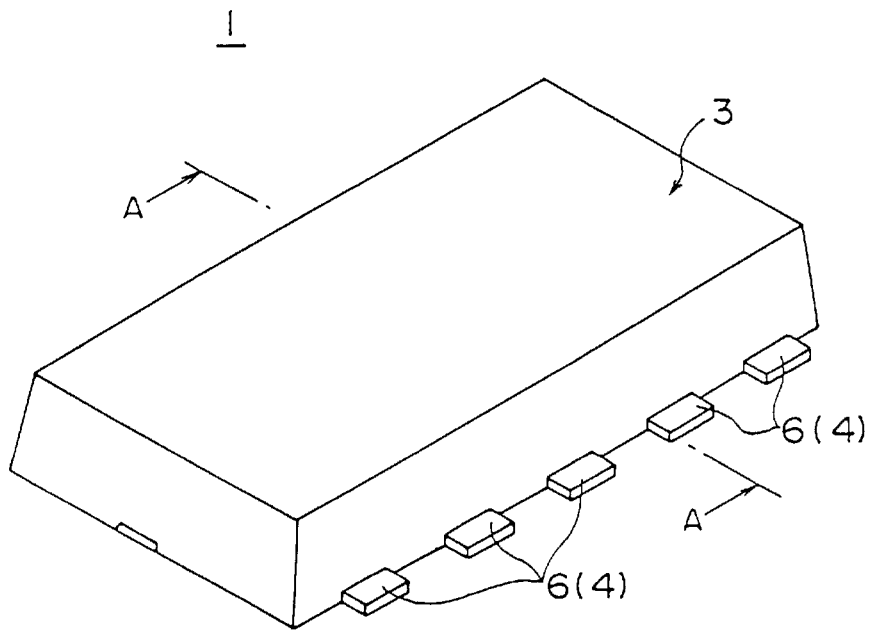
FIG. 1 is a schematic diagram showing an example of a semiconductor device of the prior art.
Figure 2:
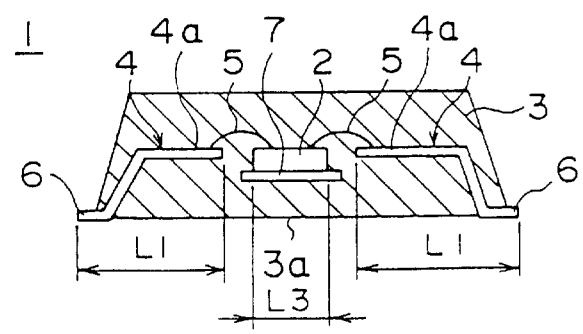
FIG. 2 is a cross-sectional diagram of the example of the semiconductor device of the prior art.
Figure 3A:
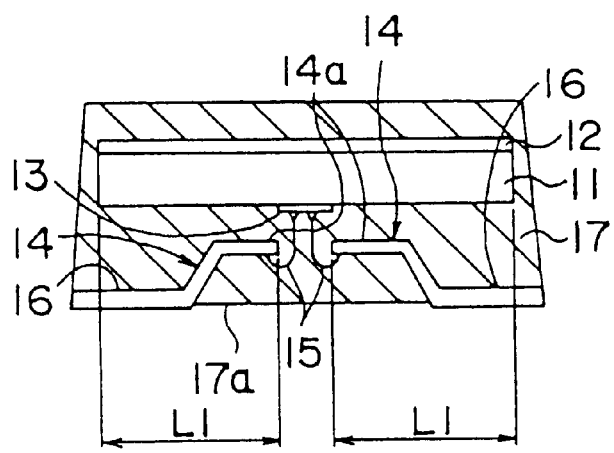
FIGS. 3A–3B are schematic diagrams showing an example of a semiconductor device of the prior art.
Figure 3B:
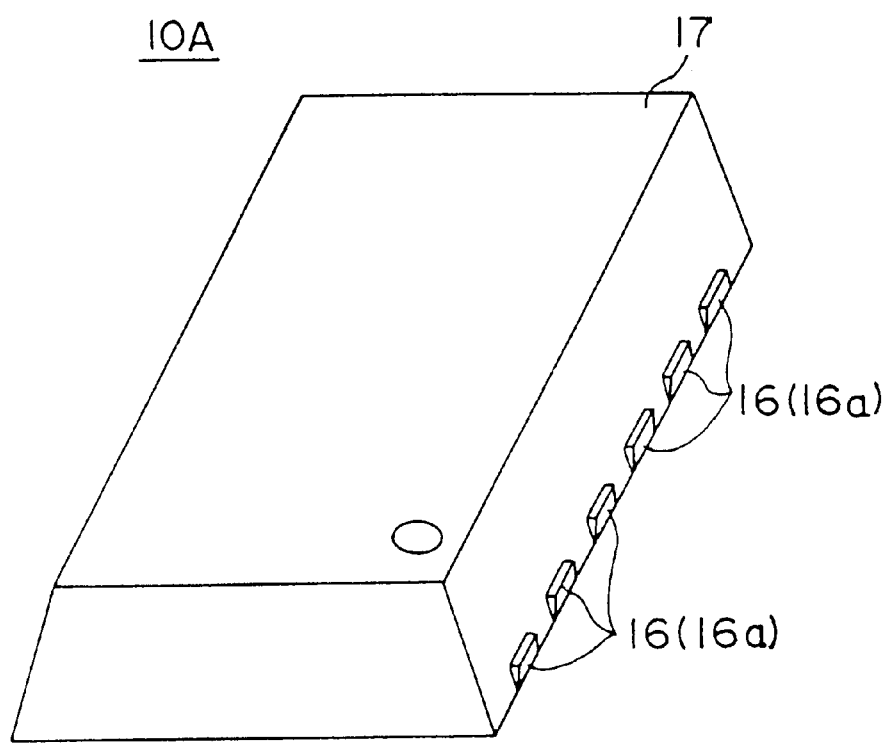
Figure 4:
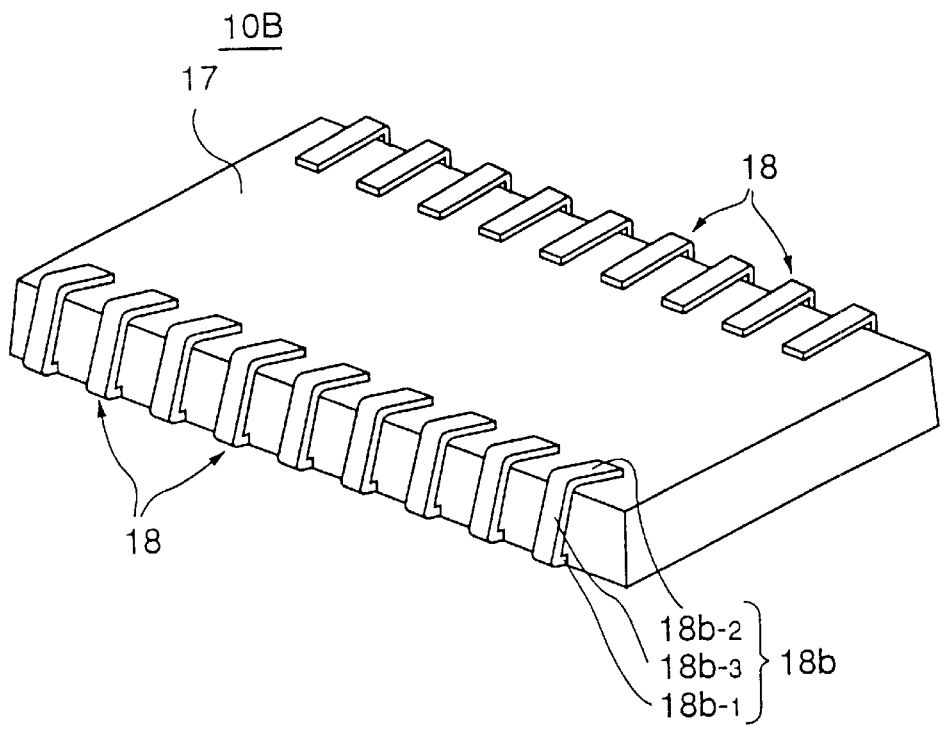
FIG. 4 is a schematic diagram showing an example of a semiconductor device of the prior art.
Figure 5:
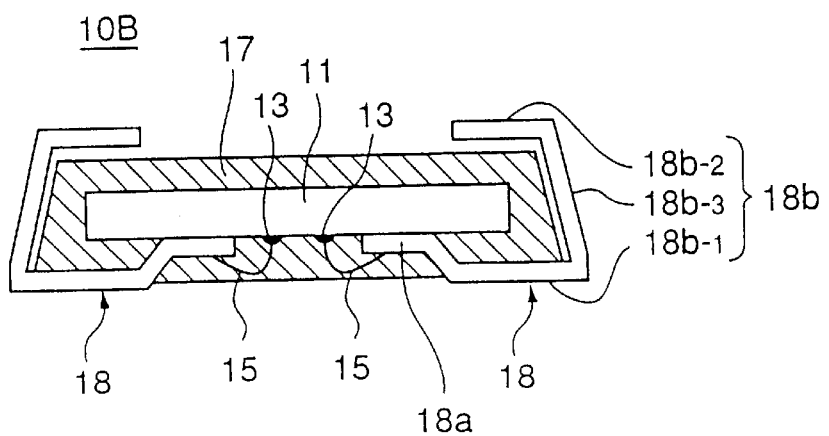
FIG. 5 is a schematic diagram showing an example of a semiconductor device unit of the prior art.
Figure 6:
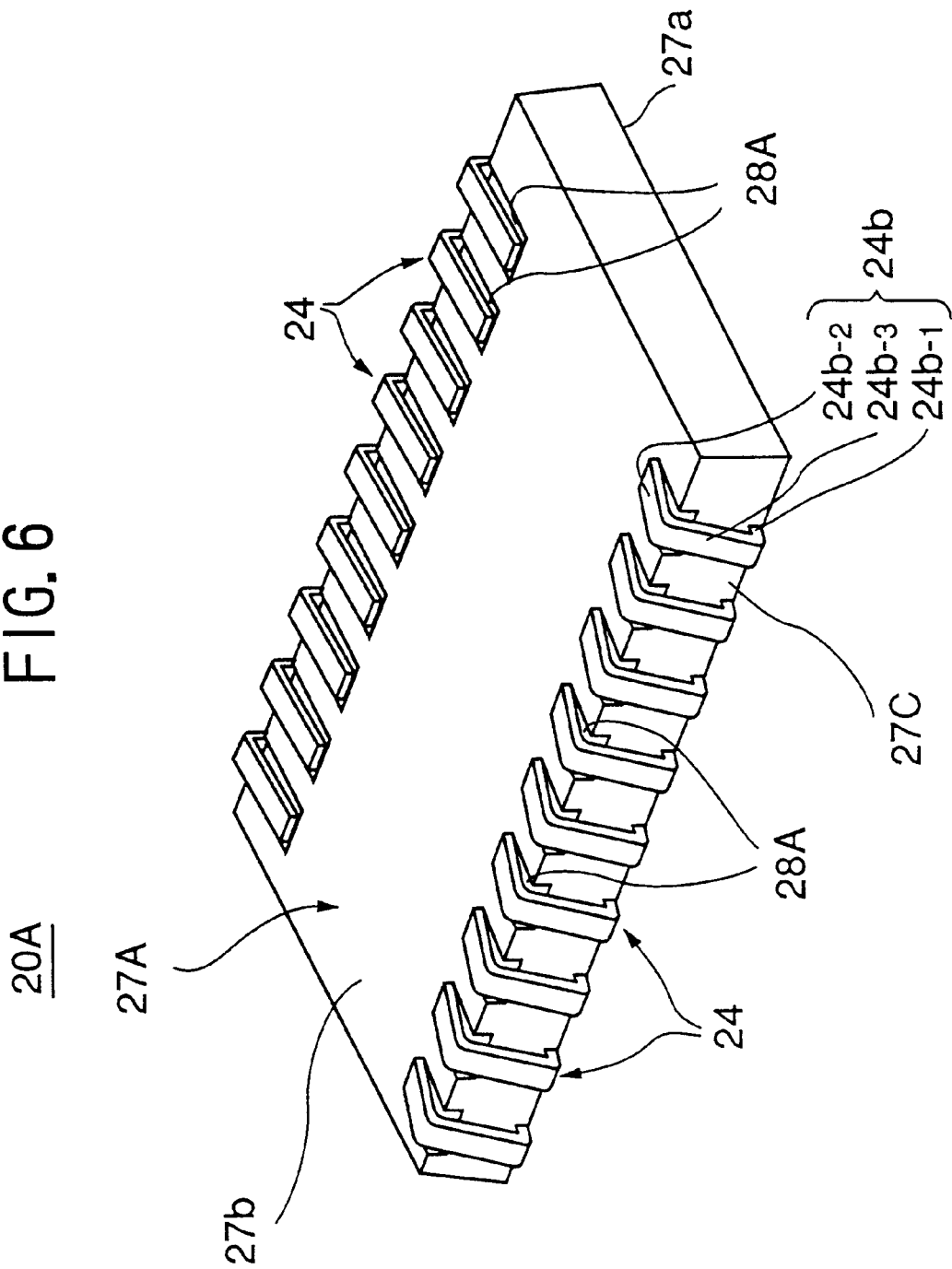
FIG. 6 is a perspective view of a first embodiment of a semiconductor device of the present invention.
Figure 7:
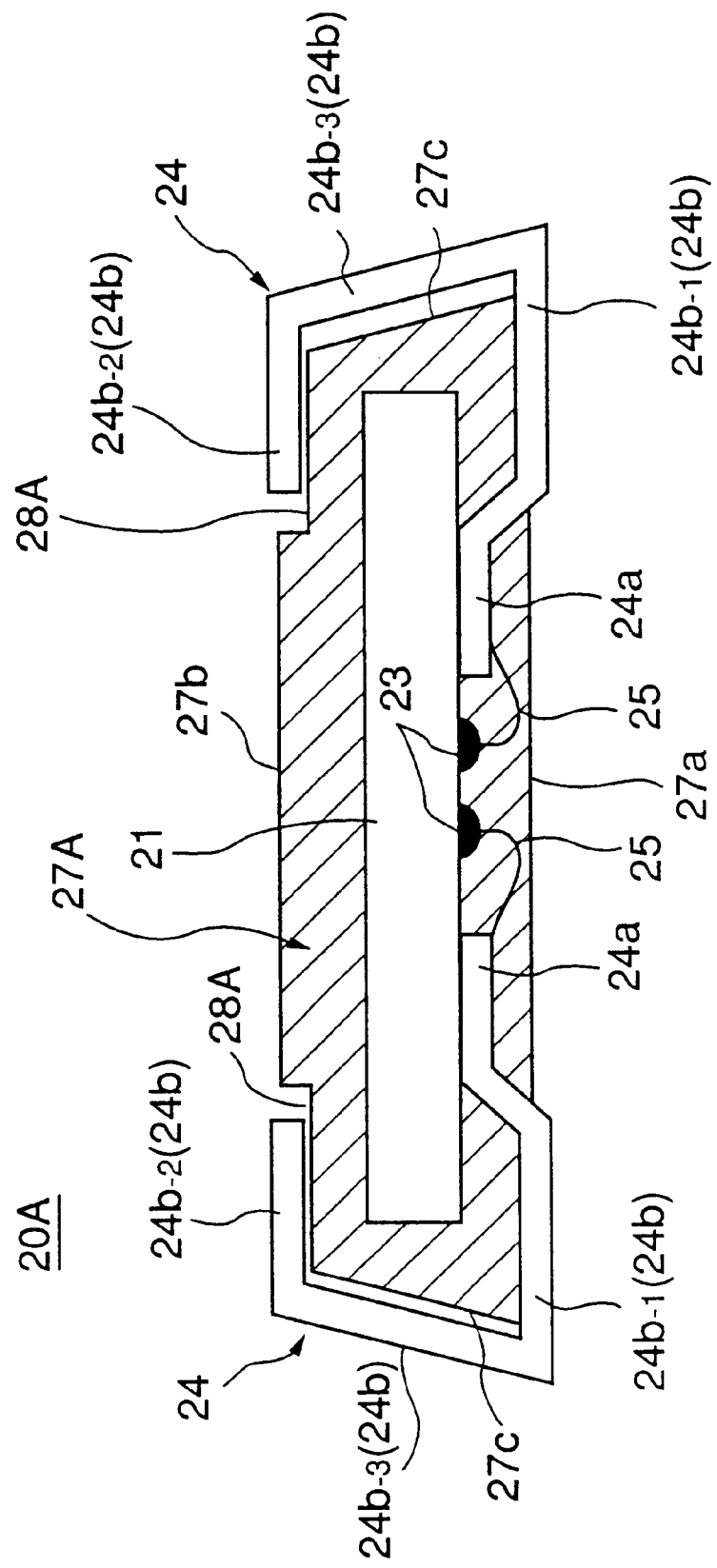
FIG. 7 is a cross-sectional diagram of the first embodiment of the semiconductor device of the present invention.
Figure 8:
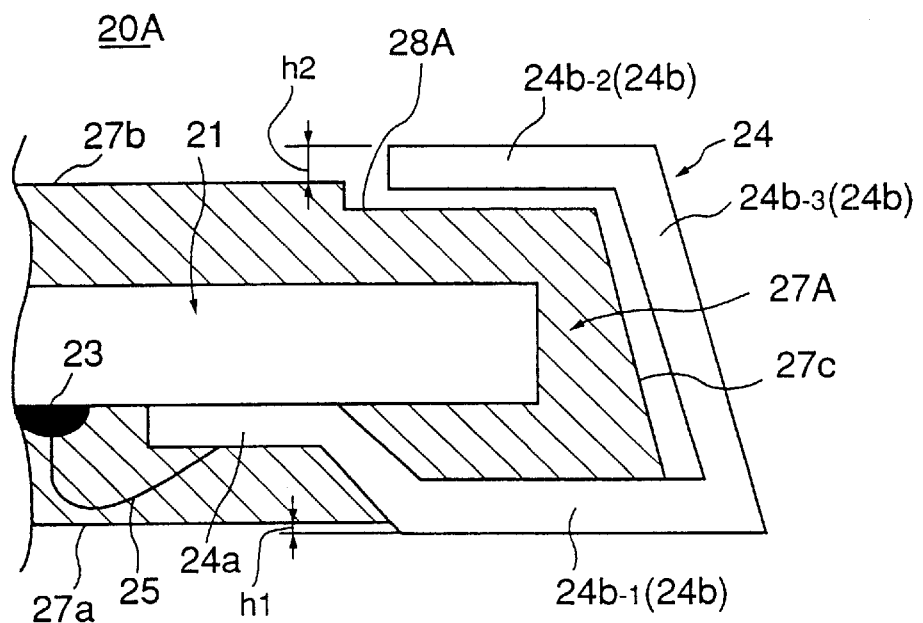
FIG. 8 is a partial cross-sectional diagram of the first embodiment of the semiconductor device of the present invention.
Figure 12:
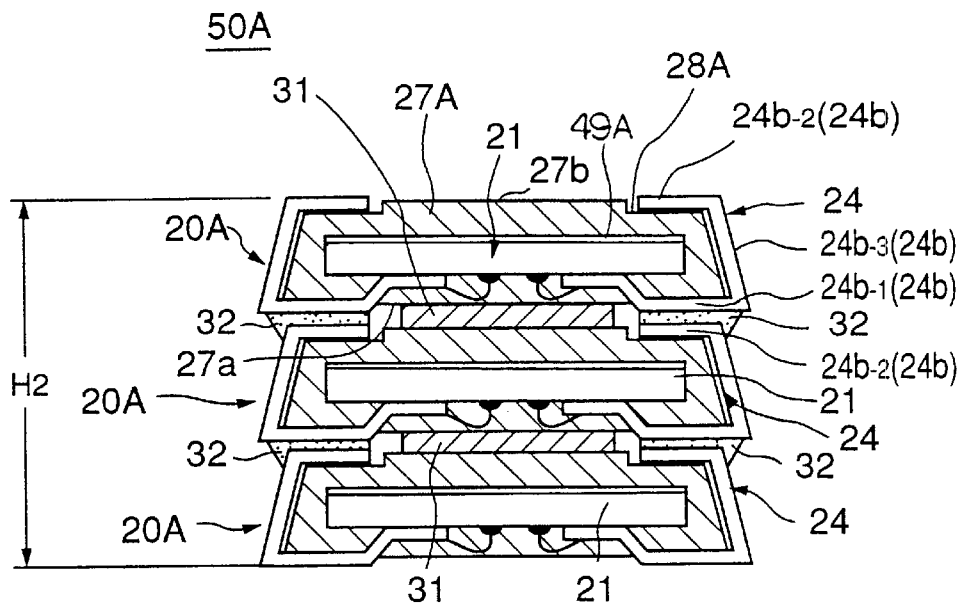
FIG. 12 is a cross-sectional diagram of a first embodiment of a semiconductor device unit of the present invention.

FIG. 6 to FIG. 8 show a semiconductor device 20A of a first embodiment of the present invention. FIG. 6, FIG. 7 and FIG. 8 are a perspective view, a cross-sectional diagram and an enlarged detailed view of the semiconductor device 20A, respectively. Also, FIG. 12 shows a semiconductor device unit 50A of a first embodiment of the present invention. The semiconductor device unit 50A is constructed such that a plurality of the semiconductor devices 20A (for example, three semiconductor devices in FIG. 12) of the first embodiment are vertically stacked.

First of all, a structure of the semiconductor device 20A will be described. A semiconductor chip 21 is for example a chip used as a memory chip and is comparatively large in size. The semiconductor chip 21 is provided with electrode pads 23 which are placed along the central longitudinal zone on the surface of the semiconductor chip 21.

Also, in FIGS. 6–8, the semiconductor device 20A includes a plurality of leads 24, each of which has an inner lead part 24a and an outer lead part 24b. Wires 25 connect the inner lead parts 24a to the electrode pads 23 formed on the semiconductor chip 21. The outer lead parts 24b are formed in a continuous manner with the inner lead parts 24a. Each of the outer lead parts 24b has a first terminal part 24b-1, a second terminal part 24b-2 and a third terminal part 24b-3, as will be described later.

Further, in FIGS. 6–8, there is shown a resin package 27A. The above-described semiconductor chip 1, wires 25 and inner lead parts 24a of the leads 24 are sealed in this resin package 27A so as to be protected. Considering the planar configurations, the resin package 27A has an area which is substantially equal to that of the semiconductor chip 21, so that the semiconductor device 20A is miniaturized. Thus, by miniaturizing the semiconductor device 20A, the mounting efficiency, to a mounting board, is improved. This leads to miniaturization and higher efficiency of the electronic devices carrying the semiconductor devices 10A.

Also, a plurality of top surface grooves 28A are formed on a top surface 27b of the resin package 27A. For the clarity of the description, the top surface grooves 28A will be described later.

The outer lead parts 24b of the leads 24 are constructed so as to extend outside the resin package 27A. The outer lead parts 24b extending outside the resin package 27A are bent twice so as to form the first terminal parts 24b-1, the second terminal parts 24b-2 and the third terminal parts 24b-3.

The first terminal parts 24b-1 are formed so as to be exposed from a bottom surface 27a of the resin package 27A. The second terminal parts 24b-2 are formed so as to oppose the top surface 27b of the resin package 27A. The third terminal parts 24b-3 are formed vertically upward so as to oppose a side surface 27c of the resin package 27A. In other words, the outer lead parts 24b are constructed such that they are pulled up from the bottom surface 27a to the top surface 27b of the resin package 27A along the shape of the resin package 17.

Also, the first terminal parts 24b-1 are partly embedded in the bottom surface 27a of the resin package 27A, thereby fixing the leads 24 to the resin package 27A.

In the semiconductor device 20A of the above structure, the outer lead parts 24b are bent along the shape of the resin package 27A, and pulled to the side surface 27c or to the top surface 27b of the resin package 17A. This enables the semiconductor device 20A to be electrically connected both at the top surface 27b and at the bottom surface 27a.

It is then possible to vertically stack a plurality of the semiconductor devices 20A, thereby forming the semiconductor device unit 50A shown in FIG. 12. With the semiconductor device unit 50A, a plurality of the semiconductor devices 20A can be mounted on a mounting area for a single semiconductor device 20A. Therefore, the mounting efficiency of the semiconductor device 20A may be improved.

The semiconductor device unit 50A according to the present embodiment is provided with an adhesive agent 31 between neighboring upper and lower semiconductor devices 20A. The adhesive agent 31 has heat dissipation ability. Because of this structure, heat generated within each semiconductor device 20A escapes via the adhesive agent 31 to the mounting board whereon the semiconductor device unit 50A is mounted. Therefore, the heat dissipation efficiency may be improved in such a structure that a plurality of the semiconductor devices are stacked.

Also, semiconductor devices 20A are joined together by a joining force of a solder 32 and by an adhesion force of the adhesive agent 31, so that the mechanical strength of the semiconductor device unit 50A may be improved. Accordingly, semiconductor devices 20A remain joined together even if an external force is applied. This may improve the reliability of the semiconductor device unit 50A.

Also in the semiconductor device 20A of the present embodiment, the third terminal parts 24b-3 are provided on the side surface 27 of the resin package 27A. Therefore, it is possible to horizontally stack the semiconductor devices 20A. Accordingly, it is possible to mount the semiconductor devices 20A in a three-dimensional manner. This further improves the mounting density, thereby achieving further miniaturization and higher efficiency of the electronic devices carrying the semiconductor device 20A. In FIGS. 6–8, the semiconductor device 20A without a stage is shown. However, the semiconductor device 20A utilized in the semiconductor device unit 50A shown in FIG. 12 is a structure wherein the semiconductor chip 21 is mounted on a stage 49A.

Now, the top surface grooves 28A formed on the top surface 24b of the resin package 27A will be described in detail.

The top surface grooves 28A are formed so as to correspond to the predetermined position of the second terminal parts 24b-2 at the top surface 24b of the resin package 27A. The top surface grooves 28A are constructed so as to engage with the second terminal parts 24b-2 which form a part of the outer leads 24b. Thus, because the second terminal parts 24b-2 engage with the top surface grooves 28A, the second terminal parts 24b-2 are positioned at the predetermined position at the top surface 24b of the resin package 27A.

Also, in the present embodiment, the second terminal parts 24b-2 are loosely engaged with the top surface grooves 28A. The second terminal parts 24b-2 can be slightly displaced within the top surface grooves 28A. The displacement of the second terminal parts 24b-2 should be within a range so that neighboring second terminal parts 24b-2 are not short-circuited.

As described above, the top surface grooves 28A engage with the second terminal parts 24b-2 which are a part of the outer leads 24b, thereby functioning as a positioning mechanism. Therefore even if an external force is applied to the outer leads 24b upon assembling or mounting the semiconductor device 20A, the outer lead parts 24b are prevented from being deformed or short-circuited between the neighboring outer lead parts 25b.

The top surface grooves 28A do not determine the position by engaging with the entire outer lead parts 24b, but by engaging only with the second terminal parts 24b-2 of the outer lead parts 24. When the outer lead parts 24b are positioned to the predetermined position by engaging with the top surface grooves 28A, the outer lead parts 24b can be displaced or flexibly deformed within the range that plastic deformation or a short circuit between the neighboring outer lead parts 24b does not occur.

Therefore, even if there is a difference in the rate of thermal expansion between the leads 24 and the resin package 27A, a stress produced upon heating can be released by displacement or deformation of the outer lead parts 24b.

In detail, in the present embodiment, since the top surface grooves 28A are formed only on the top surface 27b of the resin package 27A, the outer lead parts 24b are positioned only on the top surface 27b of the resin package 27A, and are free at the side surface 27c of the resin package 27A. Therefore, the stress produced is mainly absorbed at the third terminal parts 24b-3 of the outer lead parts 24b opposing the side surface 27c of the resin package 27. Also, part of the stress is absorbed when the second terminal parts 24b-2 on the top surface 27b are displaced within the top surface grooves 28A.

In other words, when the stress is produced, the third terminal parts 24b-3 at the side surface of the semiconductor device 20A are mainly displaced or deformed, and the first terminal parts 24b-1 and the second terminal parts 24b-2 on the top surface and on the bottom surface, respectively, are hardly displaced or deformed. Accordingly, the formation of cracks in the resin package 27A is positively prevented. Also, with the semiconductor device unit 50A, the solder 32 joining semiconductor devices 20A is prevented from peeling off. As can be seen from the above description, the structure of the present embodiment is particularly effective when the semiconductor devices are vertically stacked.

Also in the present embodiment, the top surface grooves 28A formed on the resin package 27A position the outer lead parts 24b. This enables the top surface grooves 28A to be simultaneously formed with the resin package 27A. Therefore it is not necessary to provide a new process for forming the top surface grooves 28A, and thus the top surface grooves 28A are easily formed.

Now the relationship between the thickness and the configuration of the outer lead parts 24b and the depth and the configuration of the top surface grooves 28A will be described.

In the present invention, as illustrated in FIG. 8, the second terminal parts 24b-2 (outer lead parts 24b) project from the surface 27b of the resin package 27A. The first terminal parts 24b-1 (outer lead parts 24b) also project from the bottom surface 27a of the resin package 27A.

In other words, the amount of projection of the first terminal parts 24b-1 from the bottom surface 27a (illustrated by an arrow h1 in FIG. 8) and the amount of projection of the second terminal parts 24b-2 from the top surface 27b (illustrated by an arrow h2 in FIG. 8) are both positive (h1>0, h2>0). Therefore, the first terminal parts 24b-1 and the second terminal parts 24b-2 project from the resin package. When the semiconductor devices 20A are vertically stacked so as to form the semiconductor device unit 50A, respective outer lead parts 24b of the upper and lower semiconductor devices 20A are positively electrically connected. In practice, this is an electrical connection between the first terminal parts 24b-1 and the second terminal parts 24b-2.

The second terminal parts 24b-2 are formed so as to extend substantially horizontally in the top surface 27b of the resin package 27A. Thus, when the semiconductor devices 20A are vertically stacked, the areas of the leads 24 in contact with each other become large. Therefore, the semiconductor devices 20A are joined with high reliability. Further, because the semiconductor devices 20A are stacked with high stability, the stability of temporary tacking is also improved. Temporary tacking is usually implemented before the proper joining process, and will be later described.

A second embodiment of the present invention will be described in the following.

Figure 9:
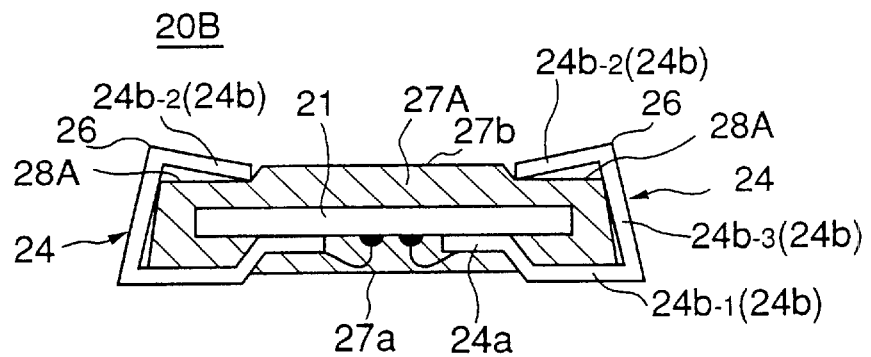
FIG. 9 is a cross-sectional diagram of a second embodiment of the semiconductor device of the present invention.
Figure 13:
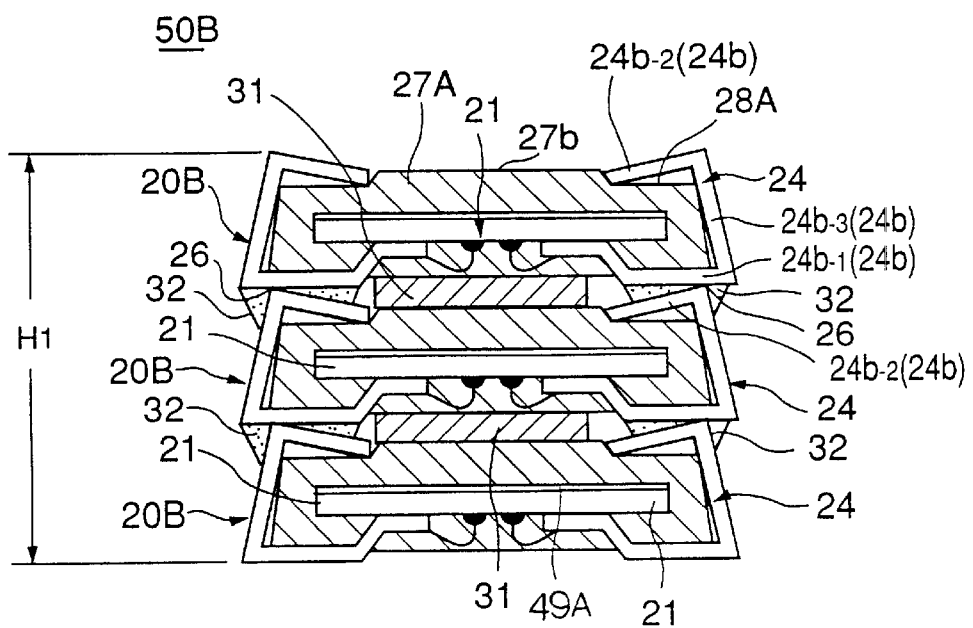
FIG. 13 is a cross-sectional diagram of a second embodiment of the semiconductor device unit of the present invention.

FIG. 9 shows a semiconductor device 20B of the second embodiment of the present invention. Also, FIG. 13 shows a semiconductor device unit 50B of the second embodiment of the present invention. In FIG. 9 and FIG. 13, components which are the same as those of FIGS. 6–8 and FIG. 12 used to describe the semiconductor device 20A and the semiconductor device unit 50A according to the first embodiment are indicated by the same reference numbers, and explanations are omitted.

The above-described semiconductor device 20A of the first embodiment is formed such that the second terminal parts 24b-2 extend substantially horizontally at the top surface of the resin package 27A. The semiconductor device 20B of the present embodiment is characterized in that the second terminal parts 24b-2 of the outer lead parts 24b, placed on the top surface 27b of the resin package 27A, are inclined against the top surface 27b.

As shown in FIG. 9, bends of the outer leads 24b or angular parts 26 formed at the border between the second terminal parts 24b-2 and the third terminal parts 24b-3 project above the top surface 27b of the resin package 27A.

Here, the semiconductor device unit 50B shown in FIG. 13 is formed by vertically stacking the semiconductor devices 20B of the above structure. Then, the angular parts 26 formed on the lower semiconductor device 20B will touch the first terminal parts 24b-1 (the outer leads 24b) at the bottom of the upper semiconductor device 20B. That is to say, the angular parts 26 formed on the lower semiconductor device 20B are directly in contact with the first terminal parts 24b-1 of the upper semiconductor device 20B.

Because of this, there will be no solder existing between the angular parts 26 of the lower semiconductor device 20B and the first terminal parts 24b-1 of the upper semiconductor device 20B. Therefore, when the semiconductor device unit 50B is formed by stacking the semiconductor devices 20B, the variation in overall height (indicated by an arrow Hi in FIG. 14) of the semiconductor device unit 50B can be reduced.

In contrast to the semiconductor device unit 50A of the first embodiment, solder 32 exists between the second terminal parts 24b-2 of the lower semiconductor device 20A and the first terminal parts 24b-1 of the upper semiconductor device 20A. Because the thickness of the solder 32 certainly varies, the overall height of the semiconductor device unit 50A (indicated by an arrow H2 in FIG. 12) may also vary. Therefore, by employing the structure of the present embodiment, the overall height H1 of the semiconductor device unit 50B will be made uniform.

In the structure of the present. embodiment, there are substantially triangular spaces between the second terminal parts 24b-2 of the lower semiconductor device 20B and the first terminal parts 24b-1 of the upper semiconductor devices 20B, both on right and left sides of the position where the angular parts 26 and the first terminal parts 24b-1 are in contact. When a plurality of the semiconductor devices 20B is joined by the solder 32, a solder filet will be formed in these spaces. Sufficient amounts of solder 32 can be filled between the first terminal parts 24b-1 and the second terminal parts 24b-2 to be joined by solder, because of these comparatively large spaces of substantially triangular shape. This may improve the joining ability of the solder.

Now, a third embodiment of the present invention will be described.

Figure 10:
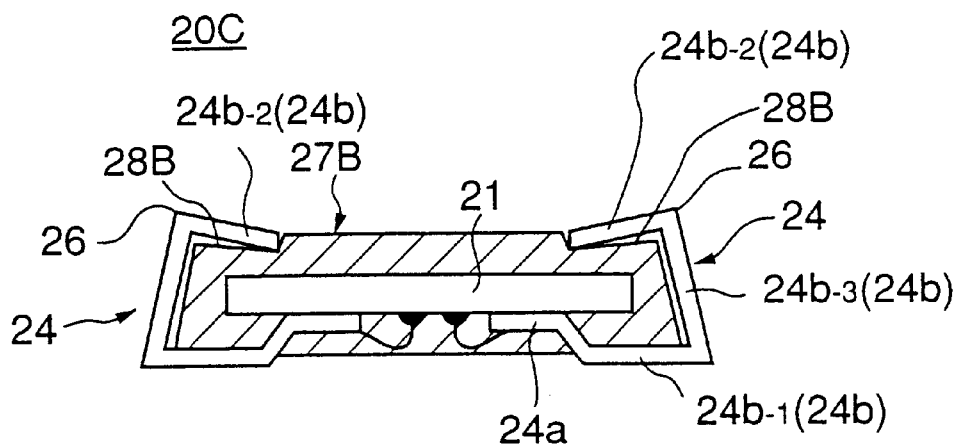
FIG. 10 is a cross-sectional diagram of a third embodiment of the semiconductor device of the present invention.

FIG. 10 shows a semiconductor device 20C of the third embodiment of the present invention. In FIG. 10, components which are the same as those of FIG. 9 used to describe the semiconductor device 20B according to the second embodiment are indicated by the same reference numbers, and explanations are omitted.

As in the semiconductor device 20B of the second embodiment, the semiconductor device 20C of the present embodiment is constructed such that the second terminal parts 24b-2 of the outer lead parts 24b are inclined against the top surface 27b of the resin package 27A. Further, in this embodiment, the top surface grooves 28B with which the second terminal parts 24b-2 engage are inclined against the top surface 27b of the resin package 27A.

In the semiconductor device 20C of the present embodiment, the angular parts 26 also project above the top surface 27b of the resin package 27A. Therefore, when a semiconductor device unit (not shown) is formed by stacking the semiconductor devices 20C, the variation in overall height of the semiconductor device unit can be reduced. Also, sufficient amounts of solder 32 can be filled between the first terminal parts 24b-1 and the second terminal parts 24b-2 to be joined by solder. This may improve the joining ability of the solder.

In the semiconductor device 20C of the present embodiment, the top surface grooves 28B are inclined against the top surface 27b of the resin package 27A. The angle of inclination of the top surface grooves 28B corresponds to the angle of inclination of the second terminal parts 24b-2. Thus, by bending the outer lead parts 24b along the top surface grooves 28B, the second terminal parts 24b-2 can be formed so as to incline.

Accordingly, there will be no need for separate instruments or molds for forming the second terminal parts 24b-2. Thus, the second terminal parts 24b-2 having a predetermined angle of inclination can be formed easily and cost effectively.

Now, a fourth embodiment of the present invention will be described.

Figure 11:
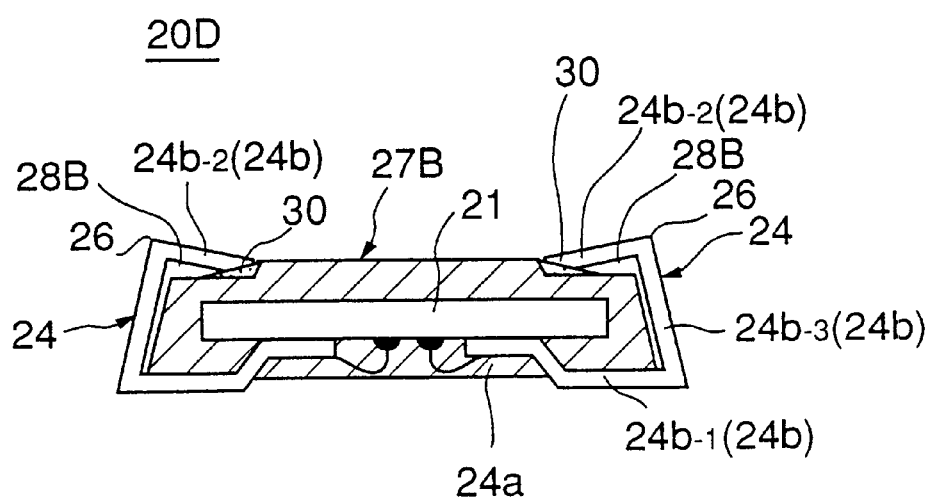
FIG. 11 is a cross-sectional diagram of a fourth embodiment of the semiconductor device of the present invention.

FIG. 11 shows a semiconductor device 20D of the fourth embodiment of the present invention. In FIG. 11, components which are the same as those of FIG. 10 used to describe the semiconductor device 20C according to the third embodiment are indicated by the same reference numbers, and explanations are omitted.

As in the semiconductor device 20C of the third embodiment, the semiconductor device 20D of the present embodiment is constructed such that the second terminal parts 24b-2 and the upper surface terminal parts 28B are inclined against the top surface 27b of the resin package 27B. Further, in the semiconductor device 20D of the present embodiment, an adhesive agent is provided at parts where the outer lead parts 24b and the top surface grooves 28B are opposed for fixing the outer lead parts 24b on the top surface grooves 28B. In the present embodiment, the adhesive agent 30 is provided at the tip of each second terminal part 24b-2.

Accordingly, the tips of the second terminal parts 24b-2 are positively engaged (fixed) to the top surface grooves 28B. This positively prevents the outer lead parts 24b from being deformed and short-circuited when the stress is applied.

In the following, a method of manufacturing a semiconductor device unit will be described with reference to FIGS. 14–15. A method of vertically stacking a plurality of the above-described semiconductor devices 20B of the second embodiment will be taken as an example.

Figure 14:
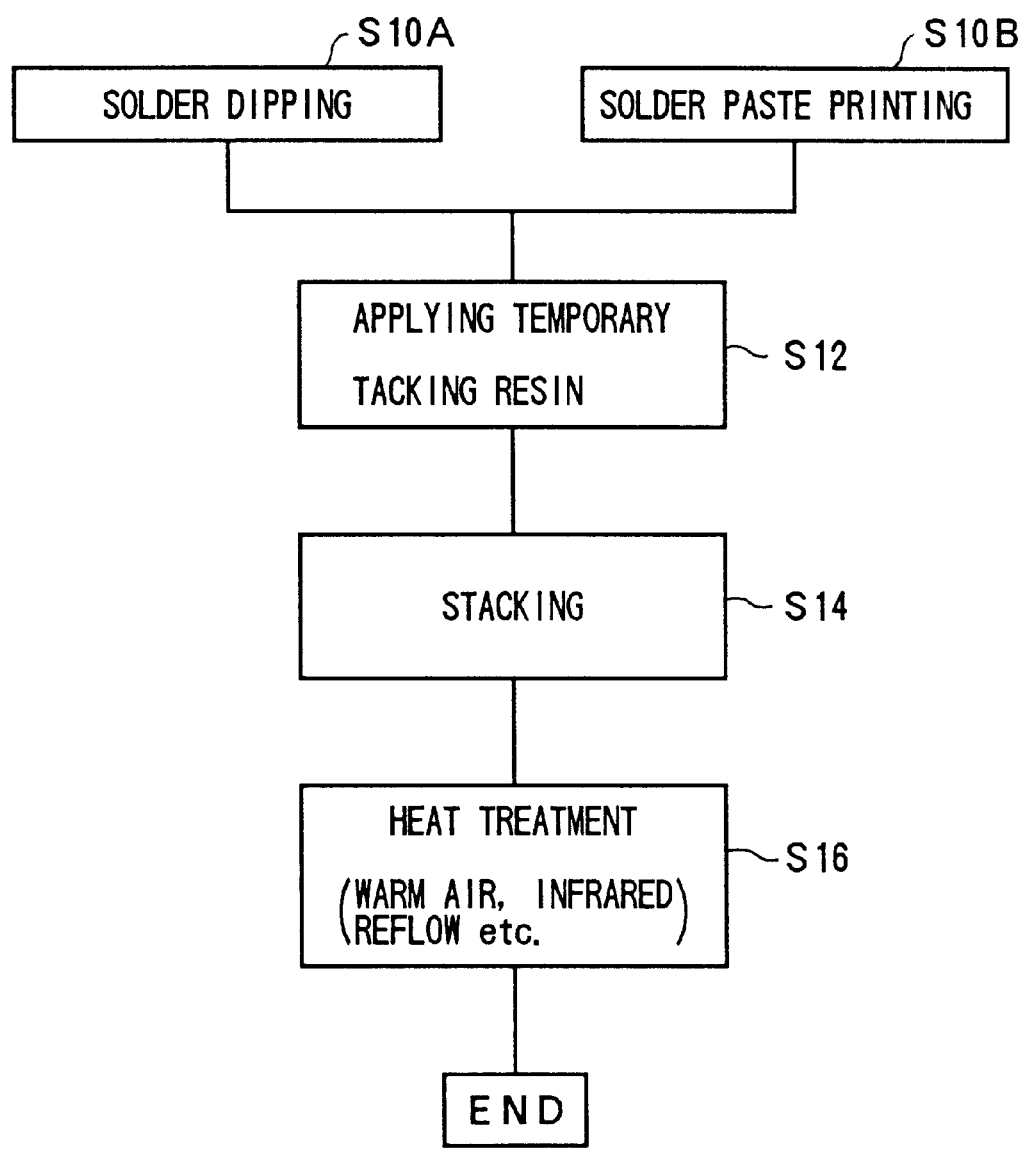
FIG. 14 is a flowchart showing a method of manufacturing the first embodiment of the semiconductor device unit of the present invention.

FIG. 14 is a flowchart showing a basic process of manufacturing a semiconductor device unit. As shown, the process starts with either step 10A ("step" being abbreviated to "S" in the figure) or step 10B. In step 10A, solder dipping is carried out and, in step 10B, solder paste printing is carried out. Both steps provide solder, which will be a joining material, to parts serving as external connection terminals of the semiconductor device.

After providing the joining material, in step 12, the adhesive agent, which will be a temporary tacking resin, is applied to the bottom surface or the top surface of the resin package of the semiconductor device. After providing the adhesion member, in step 14, a plurality of the semiconductor devices provided with the joining material are stacked. After stacking, in step 16, heat treatment such as warm air and infrared re-flow is carried out so as to melt the solder and electrically and mechanically joining the vertically neighboring semiconductor devices.

Thus, by the joining the vertically neighboring semiconductor devices after providing solder (joining material) at parts serving as external connection terminals of each semiconductor device, providing the joining material and joining can be easily carried out as compared to providing the joining material after stacking the semiconductor devices.

A semiconductor device unit will be described in detail with reference to FIGS. 15A–15C and FIGS. 16A–C.

Figure 15A:
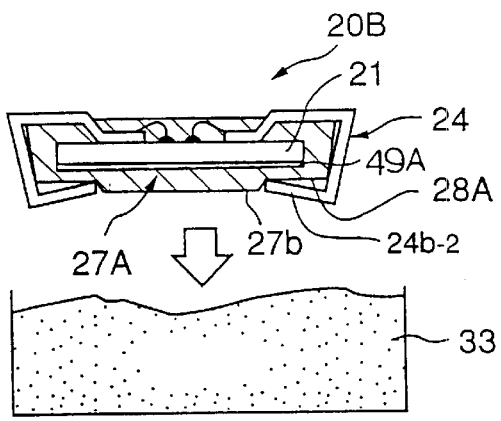
Figure 15B:
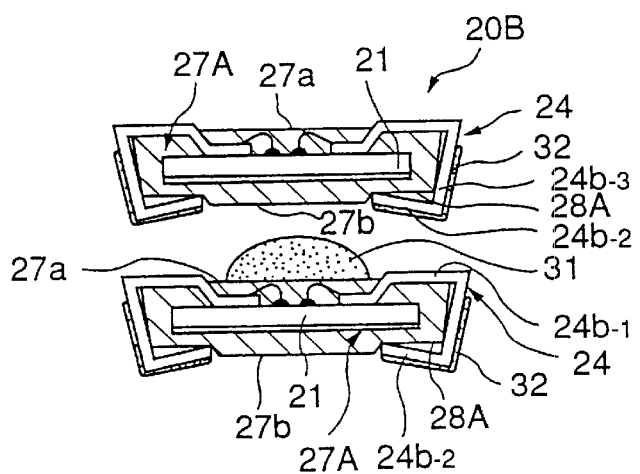
Figure 15C:
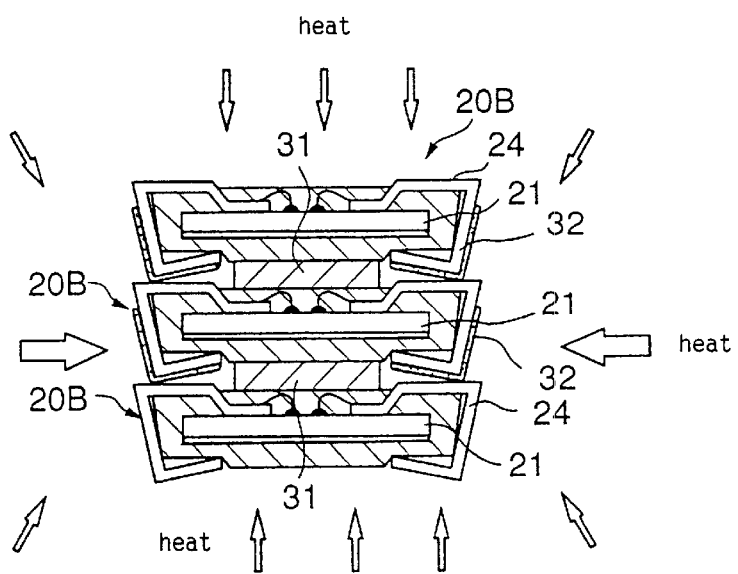

FIGS. 15A–15C show an embodiment using a solder dipping process as a joining material providing process. In the present embodiment, as shown in FIG. 15A, the second terminal parts 24b-2 are provided with the solder 32, which will serve as joining members, by dipping the second terminal parts 24b-2 serving as external connection terminals of the semiconductor device 20B into a solder reservoir 33. This solder dipping process allows the solder 32 to be provided to a number of positions simultaneously. Therefore, the joining materials are provided with improved efficiency.

FIG. 15B shows the steps of providing the adhesion member and stacking. In the step of providing the adhesion member, the adhesive agent 31 is provided to the semiconductor device 20B. This step of providing the adhesion member is implemented after the above-described step of providing the joining material and is followed by stacking.

In the present embodiment, the adhesive agent 31 is provided to the bottom surface 27a of the semiconductor device 20B. The adhesive agent 31 used in this step of providing the adhesion member has a heat dissipation ability as well as adhesiveness.

After the adhesive agent 31 is provided to the semiconductor device 20B, a plurality of the semiconductor devices 20 are stacked. Because of the adhesive agent 31 provided to each semiconductor device 20B, semiconductor devices 20B will be temporarily tacked in a stacked manner. Because of this, a plurality of the semiconductor devices 20B can be easily handled in the following process.

The temporary tacking of the semiconductors 20B is followed by the step of joining semiconductor devices. In the step of joining semiconductor devices, as shown in FIG. 15C, stacked semiconductor devices 20B are subjected to heat treatment such as warm air and infrared re-flow. The solder 32 melts as a result of the heat treatment, thereby electrically and mechanically joining vertically neighboring semiconductor devices 20B. The first terminal parts 24b-1 and the second terminal parts 24b-2 will be joined and thus the semiconductor device unit is completed.

Even after the semiconductor device unit is formed, the adhesive agent 31 provided in the step of providing the adhesion member still exists between each semiconductor device 20B. As described above, since the adhesive agent 31 is made of heat dissipating material, heat produced within each semiconductor device 20B will be dissipated to the mounting board via the adhesive agent 31. Therefore, by providing the adhesive agent 31, heat dissipation efficiency of the semiconductor device unit is improved.

Figure 16A:
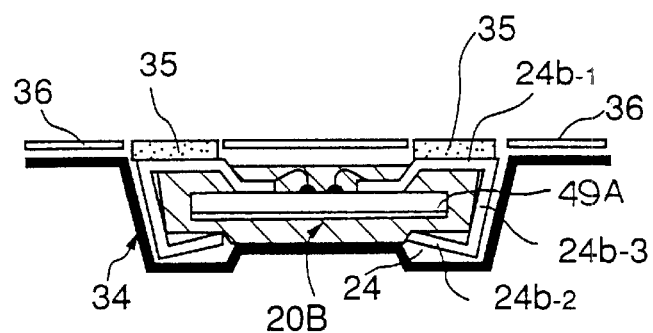
FIGS. 16A–16C are schematic diagrams showing a variant of the method of manufacturing the first embodiment of the semiconductor device unit of the present invention.
Figure 16B:
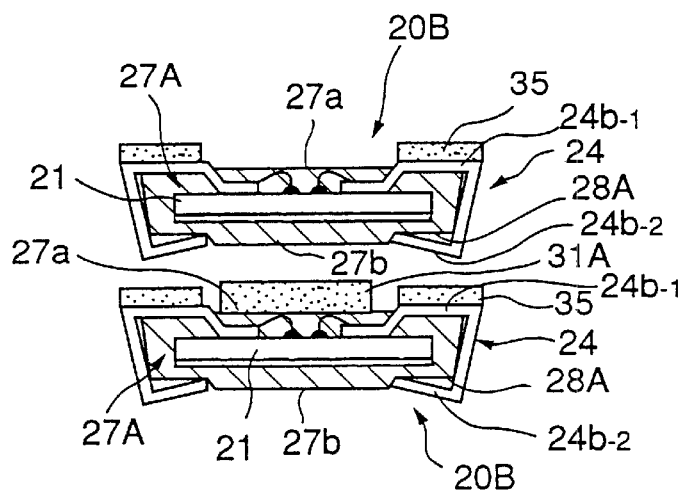
Figure 16C:
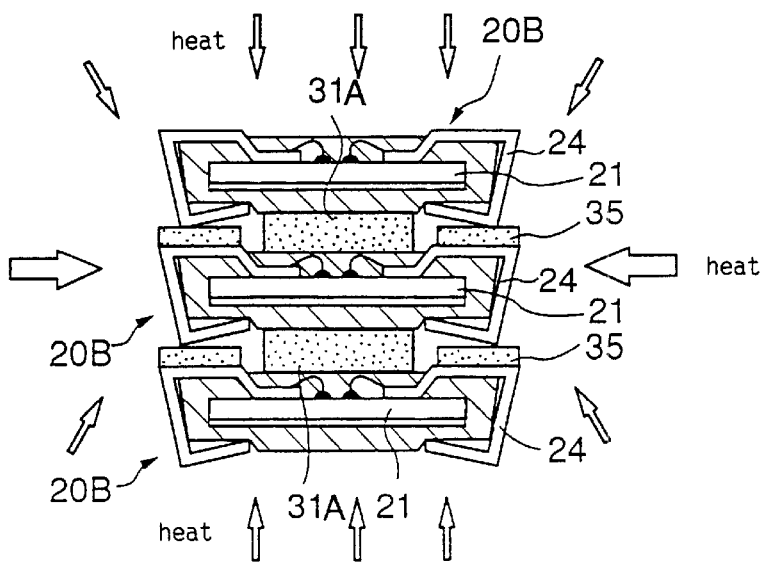

FIGS. 16A–C show an embodiment using solder paste printing as the step of providing the joining material. In the present embodiment, as shown in FIG. 16A, first, the semiconductor device 20B is positioned by being mounted on tray 34. A printing mask 36 is then provided on the surface on which the first terminal parts 24b-1, serving as the external connection terminals of the semiconductor device 20B, are provided. The first terminal parts 24b-1 are positioned at the top when the semiconductor device 20B is mounted on the tray 34.

Openings are formed in the printing mask 36 at areas opposing the first terminal parts 24b-1. By printing solder paste 35 using a squeegee (not shown), the solder paste 35 will only be applied to the first terminal parts 24b-1, as shown. Also by solder paste printing, the solder 32 will be provided to a number of positions simultaneously. Therefore, the step of providing the joining material is implemented with an improved efficiency.

FIG. 16B shows the steps of providing the adhesive agent and stacking the semiconductor devices. In the step of providing the adhesive agent, a tape-like adhesive agent 31A is provided on the semiconductor device 20B. In the present embodiment, the tape-like adhesive agent 31A is simply placed on the bottom surface 27a of the semiconductor device 20B. Therefore, the step of providing the adhesive member can be easily carried out. The tape-like adhesive agent 31A has heat dissipation ability as well as adhesiveness.

A plurality of the semiconductor devices are stacked after the tape-like adhesive agent 31A is provided to the semiconductor device 20B. Because the tape-like adhesive agent 31A is provided to each of the semiconductor devices 20B, the semiconductor devices 20B will be temporarily tacked in a stacked manner. Therefore, according to the present embodiment, stacked semiconductor devices 20B can be easily handled in the following process.

After the temporary tacking of the semiconductor devices 20B, the step of joining semiconductors will be implemented. Since the remaining steps are the same as those described with reference to FIGS. 15A–15C the description will be omitted.

Now, a semiconductor device 20E of a fifth embodiment according to the present invention will be described.

Figure 17:
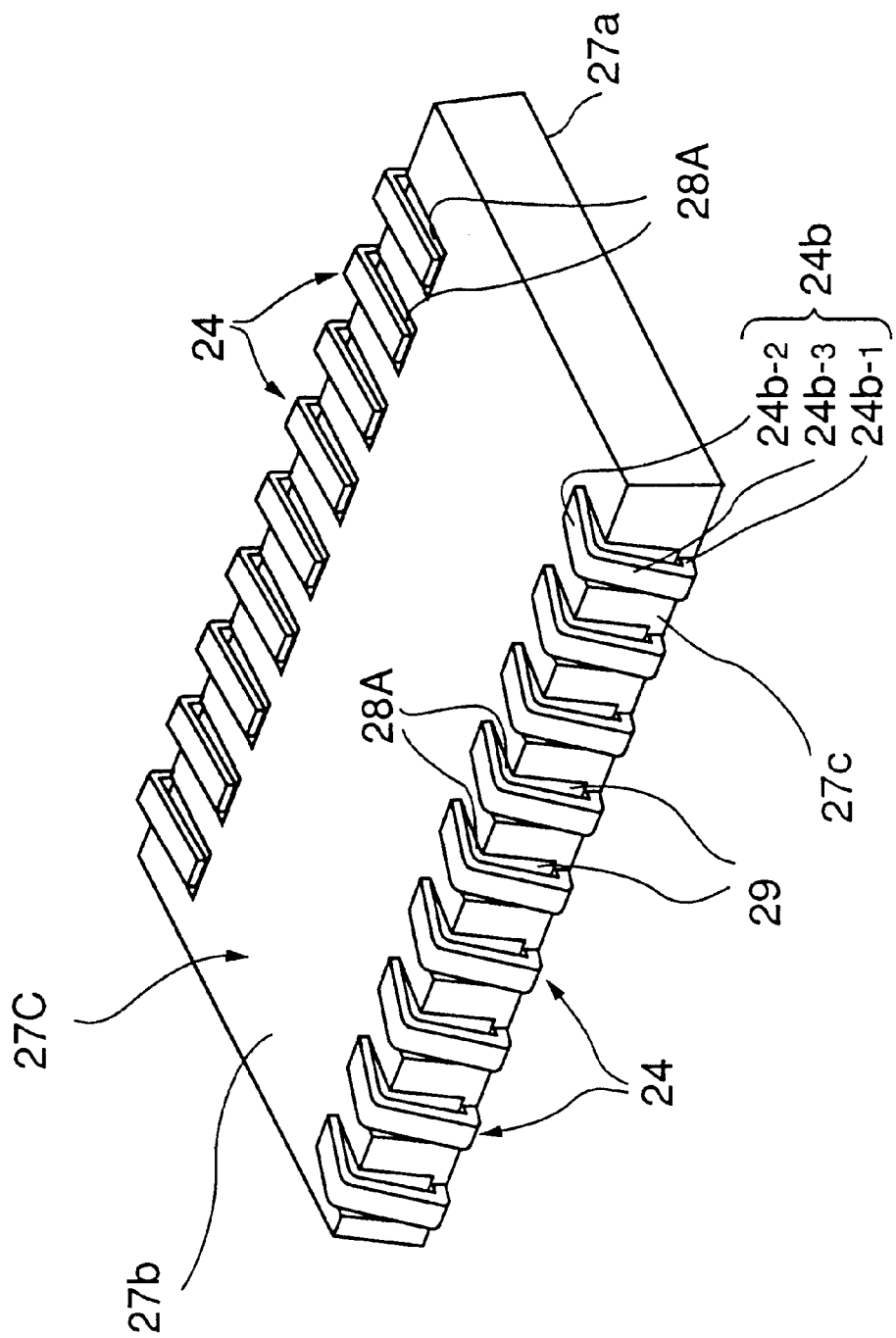
FIG. 17 is a perspective view of a fifth embodiment of the semiconductor device of the present invention.
Figure 18:
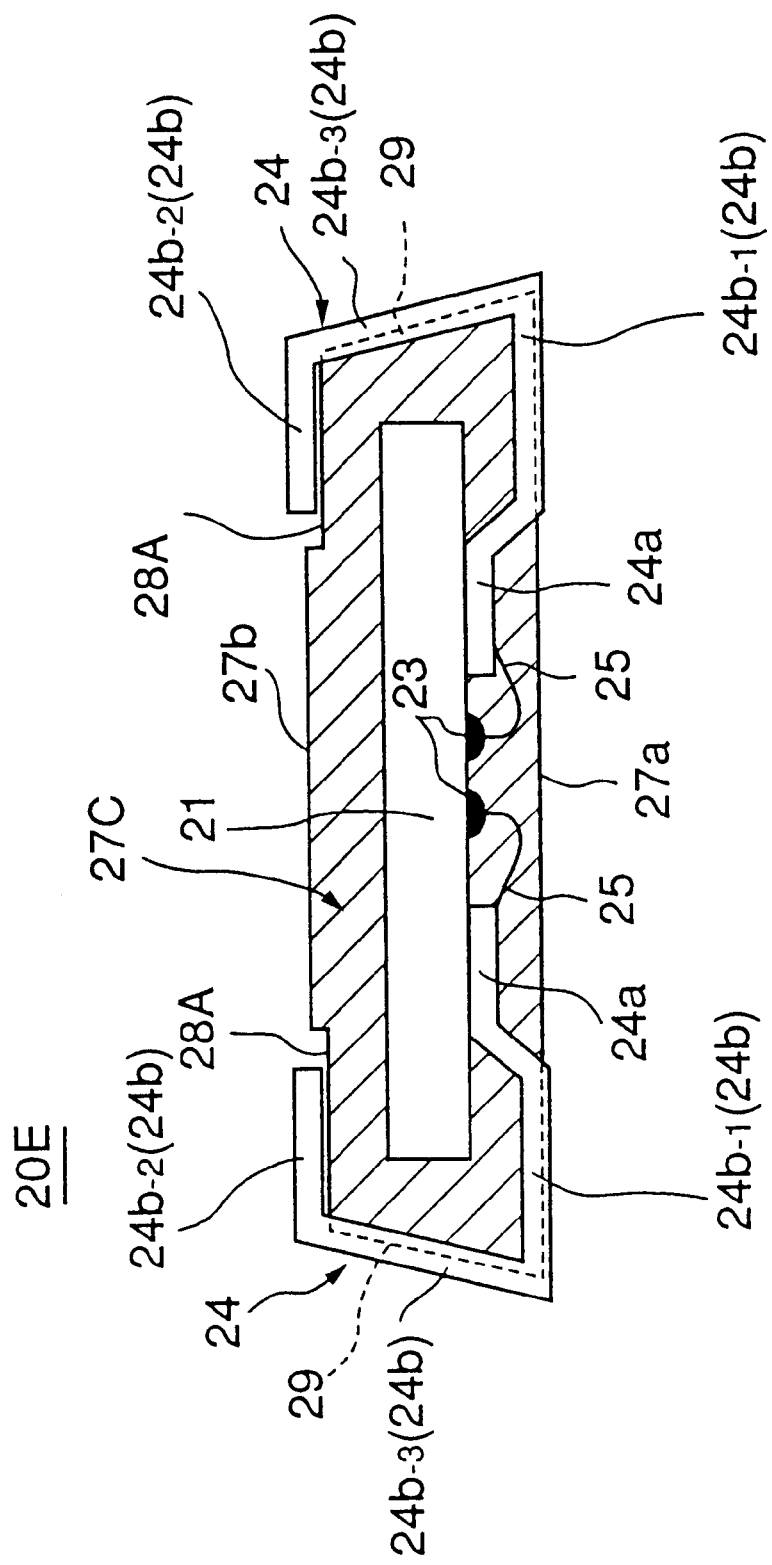
FIG. 18 is a cross-sectional diagram of the fifth embodiment of the semiconductor device of the present invention.
Figure 19:
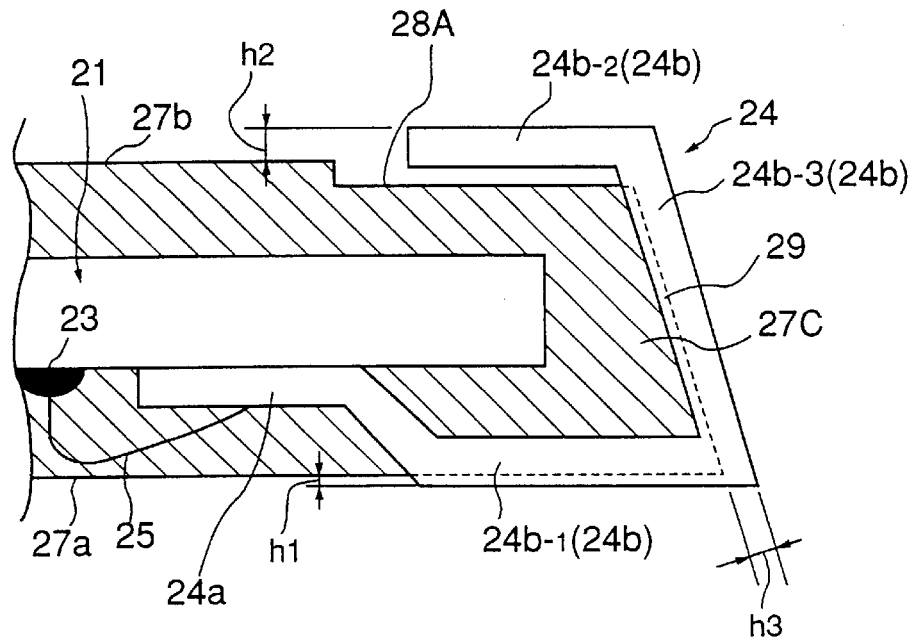
FIG. 19 is a partial cross-sectional diagram of the fifth embodiment of the semiconductor device of the present invention.
Figure 21:
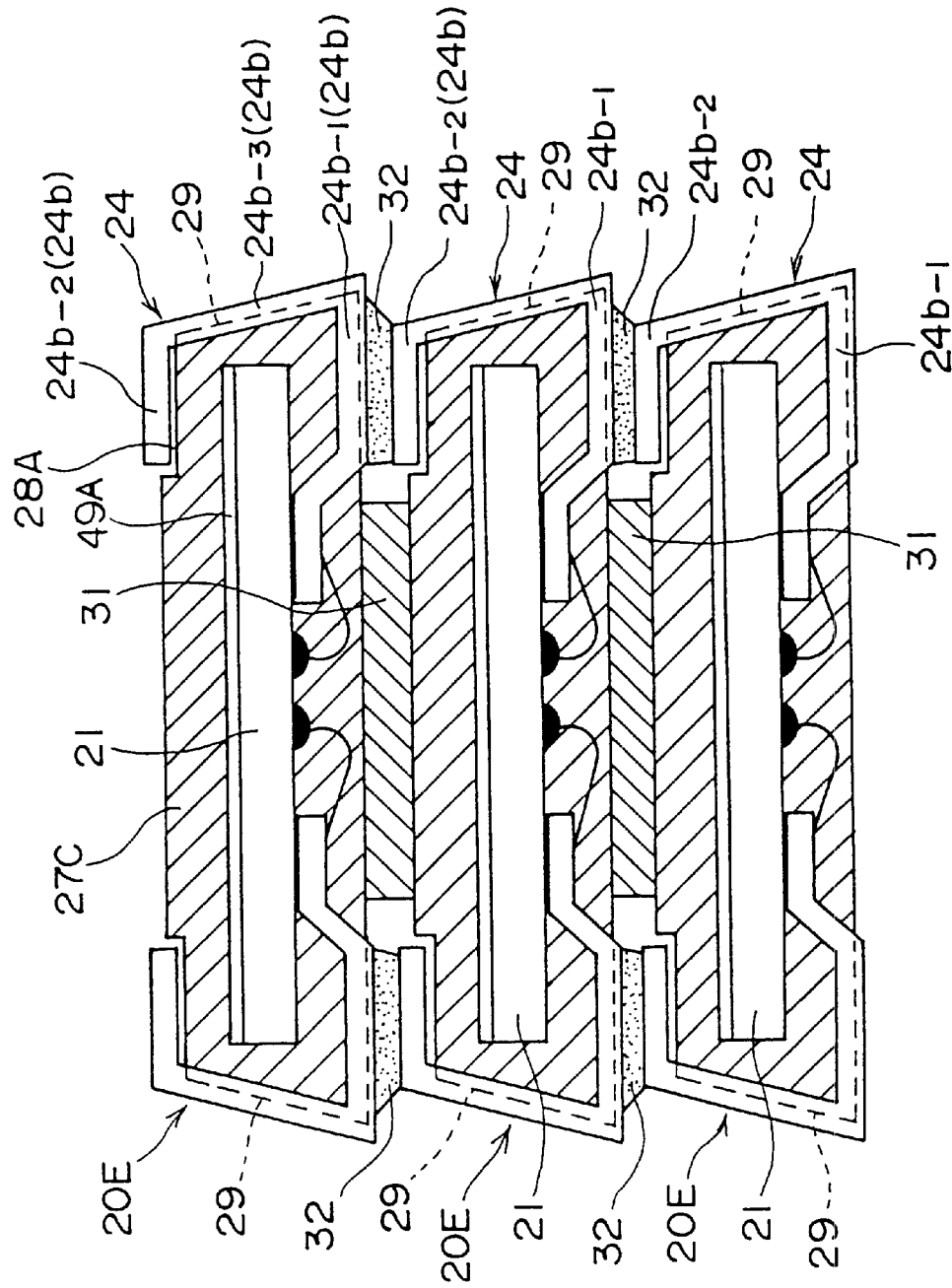
FIG. 21 is a cross-sectional diagram of a third embodiment of the semiconductor device unit of the present invention.

FIGS. 17–19 show the semiconductor device 20E of the fifth embodiment of the present invention. FIG. 17, FIG. 18 and FIG. 19 are a perspective view, a cross-sectional diagram and an enlarged detailed view of the semiconductor device 20E, respectively. Also, FIG. 21 shows a semiconductor device unit 50C of a third embodiment of the present invention. The semiconductor device unit 50C is constructed such that a plurality of the semiconductor devices 20E (for example, three semiconductor devices in FIG. 21) of the fifth embodiment are vertically stacked.

In FIGS. 17–19 and FIG. 21, components which are the same as those of FIGS. 6–8 and FIG. 12 used to describe the semiconductor device 20A and the semiconductor device unit 50A according to the first embodiment are indicated by the same reference numbers, and explanations are omitted.

First, the structure of the semiconductor device 20E will be described. In the semiconductor device 20A according to the first embodiment, only the top surface grooves 28A are formed on the resin package 27C. Further, in the semiconductor device 20E of the present embodiment, both the top surface grooves 28A and side surface grooves 29 are formed on the resin package 27C.

In a similar manner to the semiconductor device 20A according to the first embodiment, the top surface grooves 28A provided on the semiconductor device 20E according to the present embodiment are formed so as to correspond to the predetermined positions of the second terminal parts 24b-2 on the top surface 24b of the resin package 27C. The top surface grooves 28A are constructed so as to engage with the second terminal parts 24b-2 forming parts of the outer lead parts 24b. Accordingly, because the second terminal parts 24b-2 engage the top surface grooves 28A, the second terminal parts 24b-2 will be positioned at their predetermined position on the top surface 24b of the resin package 27C.

The side surface grooves 29 are formed so as to correspond to the predetermined position of the third terminal parts 24b-3 on the side surface 24c of the resin package 27C. The side surface grooves 29 are constructed so as to engage with the third terminal parts 24b-3 forming parts of the outer lead parts 24b. Accordingly, because the third terminal parts 24b-3 engage the side surface grooves 29, the third terminal parts 24b-3 will be positioned at their predetermined position on the side surface 24c of the resin package 27C.

Also, in the present embodiment, the second and the third terminal parts 24b-2 and 24b-3 loosely engage with the top surface grooves 28A and the side surface grooves 29, respectively. This allows the second and the third terminal parts 24b-2 and 24b-3 to be slightly displaced within the top surface grooves 28A and the side-surface grooves 29. The displacement of the second and third terminal parts 24b -2 and 24b -3 should be within the range that neighboring second and third terminal parts 24b-2 and 24b-3 are not short-circuited.

As described above, the top surface grooves 28A engage with the second terminal parts 24b-2 which are parts of the outer leads 24b and the side surface grooves 29 engage with the third terminal parts 24b-3 which are parts of the outer leads 24b. Thus, the top surface grooves 28A and the side surface grooves 29 serve as a positioning mechanism. Therefore in a case when an external force is applied to the outer leads 24b upon assembling or mounting the semiconductor device 20E, the outer lead parts 24b are prevented from being deformed or short-circuited between the neighboring outer lead parts 25b.

Particularly, in the semiconductor device 20E of the present embodiment, since the third terminal parts 24b-3 also engage with the side surface grooves 29 as well as the second terminal parts 24*b*-2, the third terminal parts 24*b*-3 are prevented from being deformed or short-circuited.

The second and the third terminal parts 24*b*-2 and 24*b*-3 loosely engage with the top surface grooves 28A and the side surface grooves 29, respectively, and are not embedded or fitted into the top surface grooves 28A and the side surface grooves 29. When the second and the third terminal parts 24*b*-2 and 24*b*-3 are positioned at the predetermined position by engaging with the top surface grooves 28A and the side surface grooves 29, the second and the third terminal parts 24*b*-2 and 24*b*-3 can be displaced or flexibly deformed. The displacement and the flexible deformation are limited within the range in which plastic deformation or a short circuit between the neighboring outer lead parts 24*b* will not occur.

Therefore, even if there is a difference in the rate of thermal expansion between the leads 24 and the resin package 27A, and a stress is produced due to the difference in the rate of thermal expansion upon heating, the stress produced can be released by displacing or deforming the outer lead parts 24*b*.

In the semiconductor device 20E according to the present embodiment, the displacement and the deformation of the outer lead parts 24*b* are limited compared to that of the semiconductor device 20A of the first embodiment, because the third terminal parts 24*b*-3 engage with the side surface grooves 29. When the semiconductor chip 21 is mounted with high-density, the number of the outer lead parts 24*b* increases. This results in the width and the thickness of the outer lead parts 24*b* being reduced. In this case, the mechanical strength of the outer lead parts 24*b* is reduced, causing the outer lead parts 24*b* to be easily deformed, for example, by external force.

Even in the above case, with the semiconductor device 20E of the present embodiment, the outer lead parts 24*b* are positively prevented from being deformed or short-circuited, since the second and the third terminal parts 24*b*-2 and 24*b*-3 engage with the top surface grooves 28A and the side surface grooves 29. Further, as described above, because the second and the third terminal parts 24*b*-2 and 24*b*-3 loosely engage with the top surface grooves 28A and the side surface grooves 29, respectively, the stress produced upon heating is positively absorbed or released. Therefore, the resin package 27C is prevented from cracking. Also, as shown in FIG. 21, when the semiconductor device unit 50C is manufactured using the semiconductor devices 20E of the fifth embodiment, the solder 32 at the joining parts is prevented from peeling.

The top surface grooves 28A and the side surface grooves 29 can be simultaneously formed in the step of forming the resin package 27C. Therefore, the top surface grooves 28A and the side surface grooves 29 are easily formed.

In the following, the relationship between the thickness and configuration of the outer lead parts 24*b* and the depth and configuration of the top surface grooves 28A and the side surface grooves 29 will be described.

In the present embodiment, as shown in FIG. 8, the first terminal parts 24*b*-1 (outer lead parts 24*b*) are formed so as to project from the bottom surface 27*a* of the resin package 27C. The second terminal parts 24*b*-2 are formed so as to project from the top surface 27*b* of the resin package 27C when in engagement with the top surface grooves 28A. Further, the third terminal parts 24*b*-3 are formed so as to project from the side surface 27*c* of the resin package 27C when in engagement with the side surface grooves 29.

That is to say, the amount of projection of the first terminal parts 24*b*-1 from the bottom surface 27*a*, indicated by an arrow hi in FIG. 8, the amount of projection of the second terminal parts 24*b*-2 from the top surface 27*b*, indicated by an arrow h2 in FIG. 8, and the amount of projection of the third terminal parts 24*b*-3 from the side surface 27*c*, indicated by an arrow h3 in FIG. 8, all possess positive values (h1>0, h2>0, h3>0).

By employing the above structure, the first, the second and the third terminal parts 24*b*-1, 24*b*-2 and 24*b*-3 are projected from the resin package 27A. Therefore, when the semiconductor device unit is formed by vertically and horizontally stacking the semiconductor devices 20E, electric connection between each of the outer lead parts 24*b* of the vertically and horizontally neighboring semiconductor devices 20E is assured. The semiconductor device unit 50C shown in FIG. 21 is of a structure such that the semiconductor devices 20E are vertically stacked.

Now, a semiconductor device 20F according to a sixth embodiment of the present invention will be described.

Figure 20:
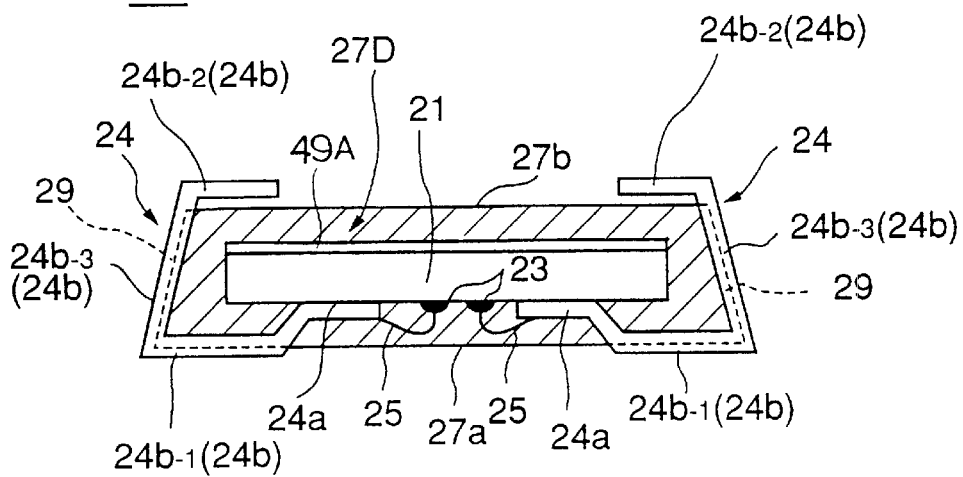
FIG. 20 is a cross-sectional diagram of a sixth embodiment of the semiconductor device of the present invention.

FIG. 20 is a cross-sectional diagram of the semiconductor device 20F of the sixth embodiment of the present invention. In FIG. 20, components which are the same as those of FIGS. 17–19 used to describe the semiconductor device 20E according to the fifth embodiment are indicated by the same reference numbers, and explanations are omitted.

In the above-described semiconductor device 20E according to the fifth embodiment, the top surface grooves 28A and the side surface grooves 29 are both formed on the resin package 27C. However, in the semiconductor device 20F according to the present embodiment, only the side surface grooves 29 are formed on a resin package 27D.

Since only the side surface grooves 29 are formed on the resin package 27D, the outer lead parts 24*b* are positioned only on the side surface 27*c* of the resin package 27D, and are free at the top surface 24*b* of the resin package 27D. Therefore, the stress produced upon heating is mainly absorbed by displacement or deformation of the second terminal parts 24*b*-2 of the outer lead parts 24*b*.

That is to say, when the stress is produced, mainly the second terminal parts 24*b*-2 are displaced or deformed, so that the position of the third terminal parts 24*b*-3 placed on the side surface 27*c* are limited. This ensures the semiconductor devices 20F to be positively joined when the semiconductor devices are horizontally stacked.

Now, a semiconductor device 20G according to the seventh embodiment of the present invention will be described.

Figure 22:
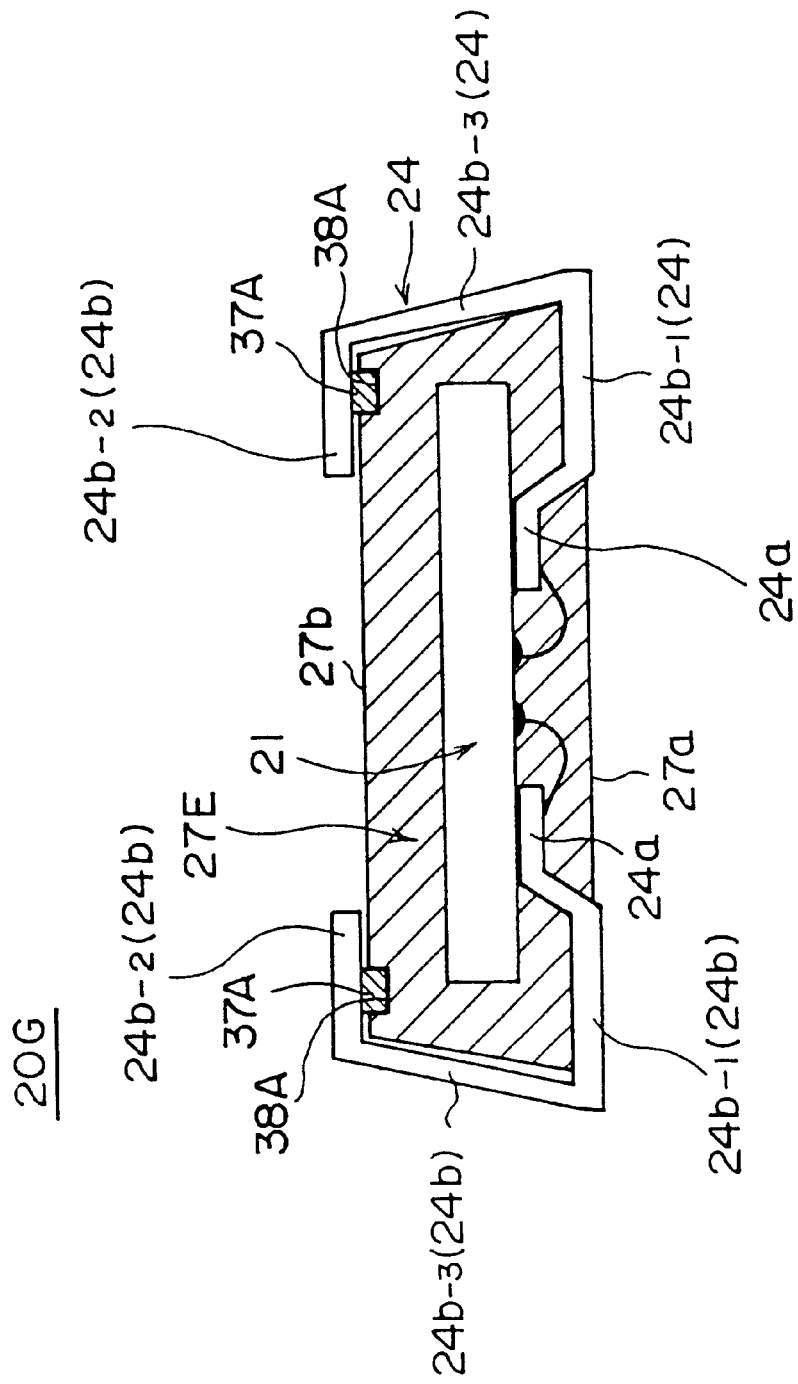
FIG. 22 is a cross-sectional diagram of a seventh embodiment of the semiconductor device of the present invention.

FIG. 22 is a cross-sectional diagram of the semiconductor device 20G of the seventh embodiment of the present invention. In FIG. 22, components which are the same as those of FIGS. 6–8 used to describe the semiconductor device 20A according to the first embodiment are indicated by the same reference numbers, and explanations are omitted.

In the semiconductor devices 20A–20F according to each embodiment described above, the outer lead parts 24*b* are positioned by engaging parts of the outer lead parts 24*b* to the top surface grooves 28A, 28B or to the side surface grooves 29.

However, in the semiconductor device 20G according to the present embodiment, engagement members 37A (first engagement parts) are formed on the outer lead parts 24*b* and engagement recesses 38A (second engagement parts) are formed on a resin package 27E. The engagement members 37A are engaged with the engagement recesses 38A, so that the outer lead parts 24b are positioned. In other words, the engagement members 37A and the engagement recesses 38A cooperate so as to establish a positioning mechanism.

The engagement members 37A are made of a resin material which is also used to form the resin package 27E. The engagement members 37A are fixed to the outer lead parts 24b. The engagement members 37A can be provided individually on each of the outer lead parts 24b or can be provided so as to communicate between a plurality of the outer lead parts 24b. In the present embodiment, the engagement members 37A are formed on the second terminal parts 24b-2 of the outer lead parts 24b. Further, the engagement recesses 38A are formed on the resin package 27E at the position opposing the engagement members 37A when the outer lead parts 24b are bent.

In structure described above, in order to engage the outer lead parts 24b with the resin package 27E, the engagement members 37A are engaged with the engagement recesses 38A upon bending the outer lead parts 24b. Because of this, the outer lead parts 24b are prevented from being deformed or short-circuited.

Figure 23:
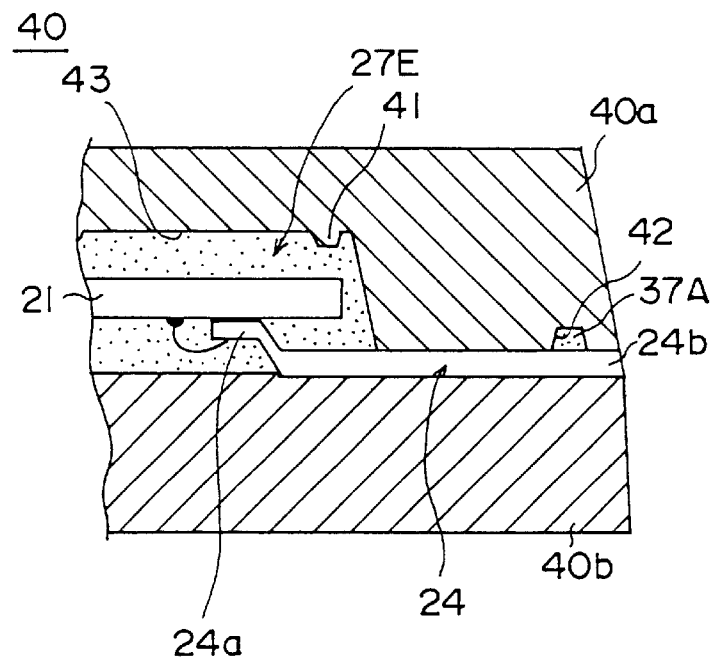
FIG. 23 is a schematic diagram showing a method of manufacturing the seventh embodiment of the semiconductor device unit of the present invention.

FIG. 23 shows a method of manufacturing the above-described semiconductor device 20G of the seventh embodiment, and particularly shows a step of sealing a resin which forms the resin package 27E. As shown in FIG. 23, when the resin package 27E is formed, the semiconductor chip 21 and the leads 24 are fitted in a mold 40 which includes an upper mold 40a and a lower mold 40b. The semiconductor chip 21 is placed within a cavity 43 formed by the upper mold 40a and the lower mold 40b, and the outer lead parts 24b are held between the upper mold 4a and the lower mold 40b.

Also, protrusions 41 are formed on the cavity 43 formed in the upper mold 42a. The protrusions 41 are positioned so as to correspond to the predetermined position of the engagement recesses 38A. Also, recesses 42 are formed at a position on the upper mold 42a which corresponds to the position of engagement members 37A on the outer lead parts 24b.

Further, the recesses 42 communicate with the cavity 43, and the resin introduced into the cavity 43 is also provided to the recesses 42. Thus, the engagement members 37A are also formed of the same material as that of the resin package 27E.

As can be understood from the above description, by forming the resin package 27E using the mold 40, the engagement members 37A and the engagement recesses 38A are simultaneously formed with the mold 40. Therefore, the semiconductor device 20G is easily and cost-effectively manufactured as compared to a manufacturing method which separately forms the engagement members 37A and the engagement recesses 38A.

Now, a semiconductor device 20H according to an eighth embodiment of the present invention will be described.

Figure 24:
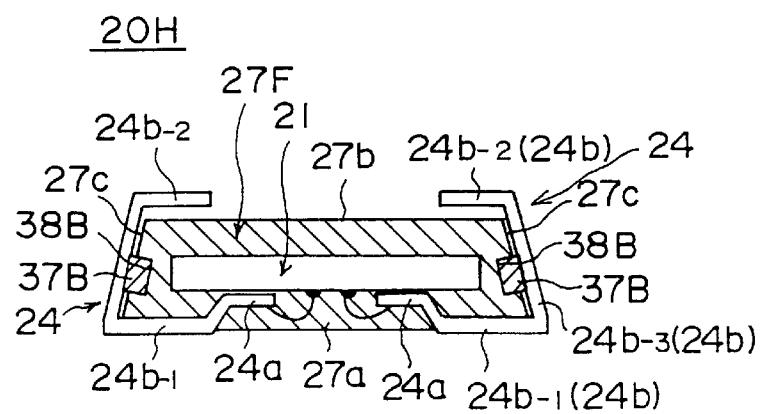
FIG. 24 is a cross-sectional diagram of an eighth embodiment of the semiconductor device of the present invention.

FIG. 24 is a cross-sectional diagram of the semiconductor device 20H of the eighth embodiment of the present invention. In FIG. 24, components which are the same as those of FIG. 22 used to describe the semiconductor device 20G according to the seventh embodiment are indicated by the same reference numbers, and explanations are omitted.

In the above-described semiconductor device 20G according to the seventh embodiment, the engagement members 37A are formed on the second terminal parts 24b-2 and the engagement recesses 38A are formed on the top surface 27b of the resin package 27E. Thus, the outer leads 24b engage with the resin package 27E on the top surface 27b of the resin package 27E by engaging the engagement members 37A with the engagement recesses 38A.

In the above structure, when the external force and stress are applied, they are mainly absorbed at the third terminal parts 24b-3 of the outer lead parts 24b. This is due to the fact that the third terminal parts 24b-3 are easily deformed compared to the second terminal parts 24b-2.

However, in the semiconductor device 20H according to the present embodiment, engagement members 37B are formed on the third terminal parts 24b-3 while forming engagement recesses 38B on the side surface 27c of a resin package 27F.

Thus, the outer leads 24b engage with the resin package 27F on the side surface 27c when the engagement members 37B engage with the engagement recesses 38. Therefore in the semiconductor device 20H of the present embodiment, when the external force and stress are applied, they are mainly absorbed at the second terminal parts 24b-2 of the outer lead parts 24b. This is due to the fact that the second terminal parts 24b-2 are easily deformed compared to the third terminal parts 24b-3. The positions of the engagement members 37A, 37B and the engagement recesses 38A, 38B are not limited to a specific position on the resin packages 27E, 27F, but can be selected so as to correspond to the positions where external force is easily applied and a thermal stress is likely to be produced.

Now, a semiconductor device 20I according to a ninth embodiment of the present invention will be described.

Figure 25:
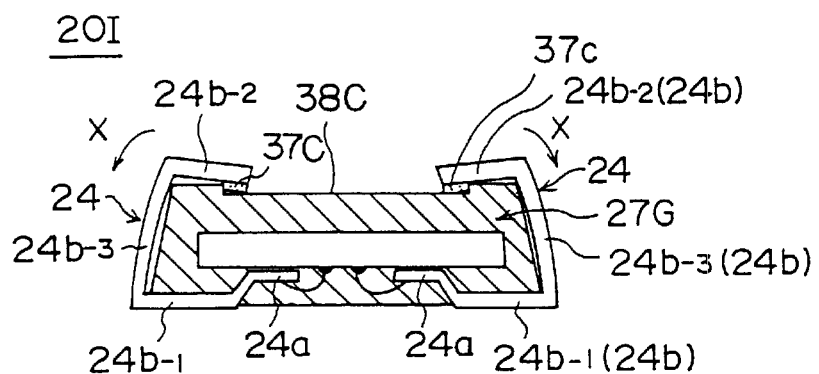
FIG. 25 is a cross-sectional diagram of a ninth embodiment of the semiconductor device of the present invention.

FIG. 25 is a cross-sectional diagram of the semiconductor device 20I of the ninth embodiment of the present invention. In FIG. 25, components which are the same as those of FIG. 22 used to describe the semiconductor device 20G according to the seventh embodiment are indicated by the same reference numbers, and explanations are omitted.

In the above-described semiconductor devices 20G and 20H according to the seventh and eighth embodiments, parts of the outer leads 24b are positioned on the resin packages 27E, 27F only by engaging the engagement members 37A, 37B with the engagement recesses 38A, 38B.

However, in the present embodiment, engagement members 37C are formed at a tip of each second terminal part 24b-2. Wide engagement recesses 38C are formed on the top surface 27b of the resin package 27B and steps are formed at both sides of the engagement recesses 38C. The engagement members 37C provided at the tips of the second terminal parts 24b-2 are constructed so as to engage with the steps of the engagement recesses 38C.

The leads 24 used in the present embodiment are formed of a spring-like, conductive material. Also when the engagement members 37C engage with the step of the engagement recesses 38C, the second terminal parts 24b-2 are formed so as to exert an elastic force in the direction of an arrow X in FIG. 25. This structure allows the second terminal parts 24b-2 to be positioned on a resin package 27G without using the adhesive agent 30 as in the above-described semiconductor device 20D according to the fourth embodiment (see FIG. 6).

Now, a semiconductor device 20J according to a tenth embodiment of the present invention will be described.

Figure 26:
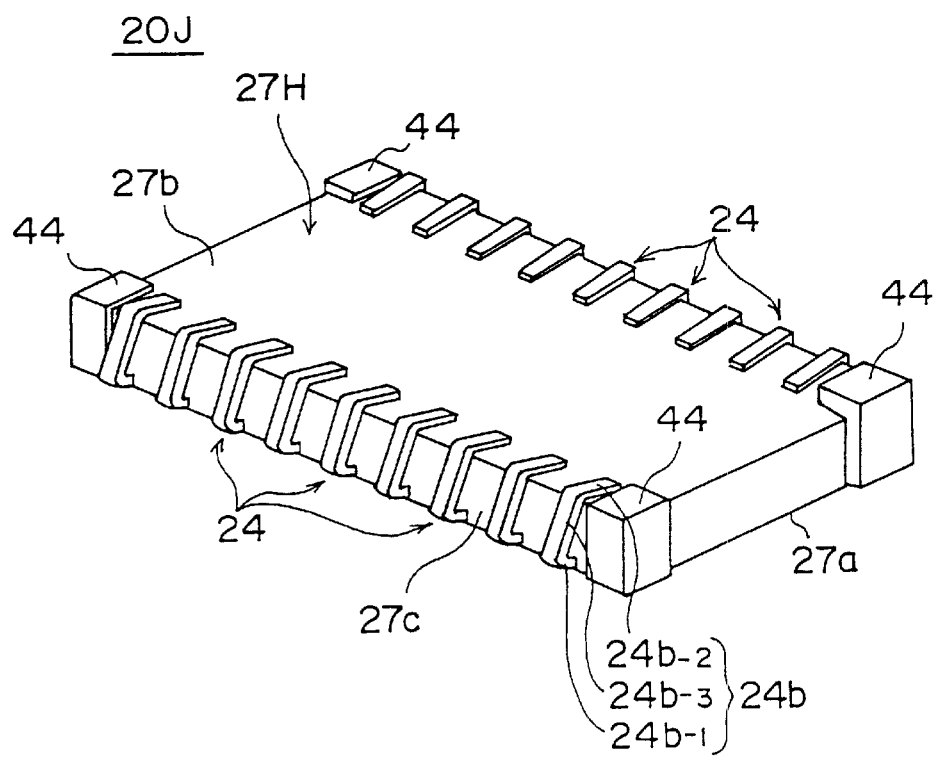
FIG. 26 is a perspective view of a tenth embodiment of the semiconductor device of the present invention.

FIG. 26 is a perspective view of the semiconductor device 20J of the tenth embodiment of the present invention. In FIG. 26, components which are the same as those of FIGS. 6–8 used to describe the semiconductor device 20A according to the first embodiment are indicated by the same reference numbers, and explanations are omitted.

In the above-described semiconductor device 20A according to the first embodiment, a plurality of the top surface grooves 28A are formed on the top surface 27b of the resin package 27A. The structure is such that the outer lead parts 24b are positioned by engaging the second terminal parts 24b-2 with the top surface grooves 28A.

However, in the semiconductor device 20J according to the present embodiment, protrusions 44 are formed at four corners of a resin package 27H instead of the top surface grooves 28A. The height of the protrusions 44 is higher than the top surface 27b of the resin package 27H and lower than the thickness of second terminal parts 24b-2 (outer lead parts 24b).

Because of this, peripheral parts (four corners of the periphery) of the area where the outer lead parts are provided are protected by the protrusions 44. Thus, when external force is applied at the side surface (side surface external force), the side surface external force can be received by the protrusions 44. Therefore, the outer lead parts 24b will not receive the side surface external force, and can be prevented from being deformed or short-circuited.

By employing the structure of the present embodiment, it is not necessary to form components such as grooves corresponding to each of the outer lead parts 24b as was necessary in a semiconductor device according to each of the above-described embodiments. Therefore, the semiconductor device of the present embodiment can be employed even in the case where the semiconductor chips 21 are mounted in a high-density manner and a number of the leads 24 is increased, thereby narrowing the lead pitch.

Now, a semiconductor device 20K according to an eleventh embodiment of the present invention and a semiconductor device unit 50D according to a fourth embodiment of the present invention will be described.

Figure 27:
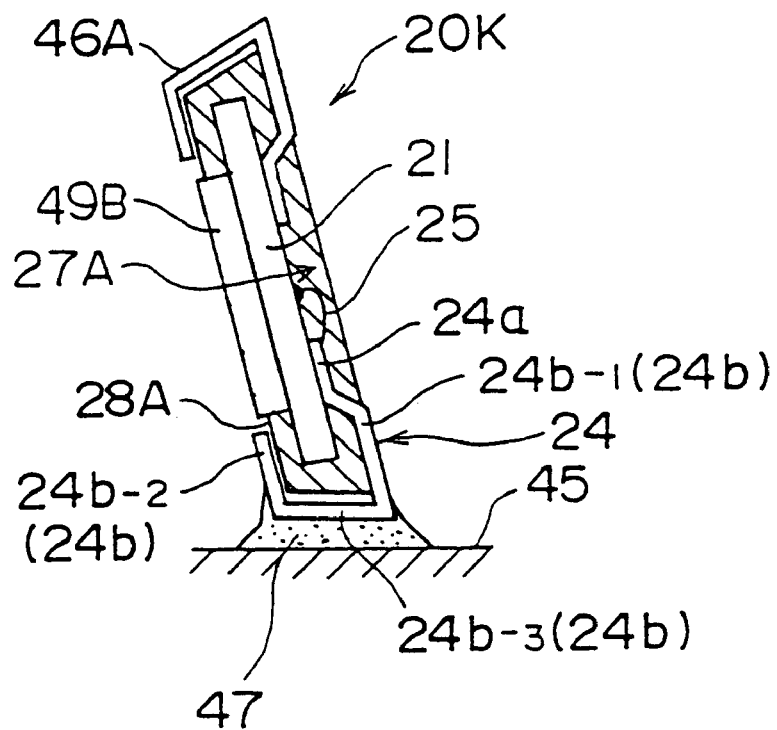
FIG. 27 is a cross-sectional diagram of an eleventh embodiment of the semiconductor device of the present invention.
Figure 28:
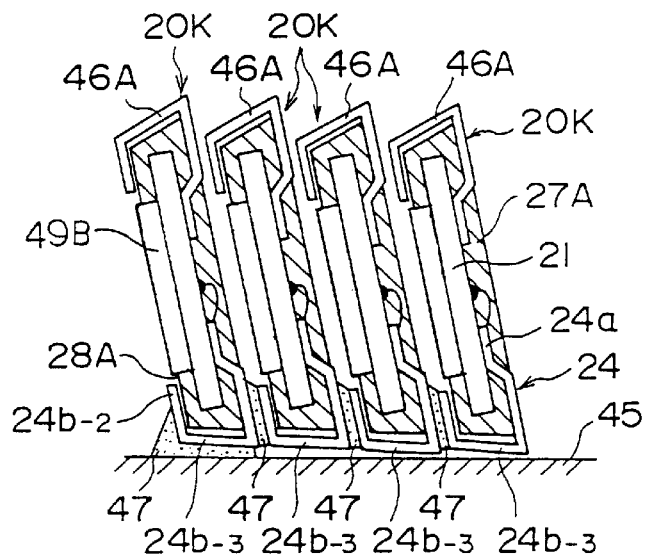
FIG. 28 is a cross-sectional diagram of a fourth embodiment of the semiconductor device unit of the present invention.

FIG. 27 is a cross-sectional diagram of a semiconductor device 20K of the eleventh embodiment of the present invention and FIG. 28 is a cross-sectional diagram of a semiconductor device unit 50D of a fourth embodiment of the present invention. In FIG. 27 and FIG. 28, components which are the same as those of FIGS. 6–8 and FIG. 12 used to describe the semiconductor device 20A and the semiconductor device unit 50A according to the first embodiment are indicated by the same reference numbers, and explanations are omitted.

The above-described semiconductor device 20A is mounted to the mounting board such that the resin package 27A is horizontal, or the first terminal parts 24b-1 are joined to the mounting board as external connection terminals.

However, with this structure, a mounting area of the semiconductor device 20A is comparatively large. Therefore the semiconductor device 20K according to the present embodiment is mounted on the mounting board 45 so as to stand on its side surface.

Because of this, the leads 24 serving as external connection terminals are all provided on a single side surface of the resin package 27A (the surface opposing the mounting board 45 in FIG. 27). On the side surface opposite to the side surface where to the leads are provided, a heat dissipation plate 46A is provided which dissipates the heat produced in the semiconductor chip 21.

As shown in FIG. 27, the semiconductor device 20K of the above structure is mounted on the mounting board 45 by joining the third terminal parts 24b-3 to the mounting surface 45 using solder 47. Accordingly, the semiconductor device 20K can be mounted on the mounting board 45 so as to stand on its side surface, and the space required for mounting is thus reduced.

Further, in the semiconductor device 20K of the present embodiment, a stage 49B on which the semiconductor chip 21 is mounted is exposed from the resin package 27A. Therefore, the heat produced in the semiconductor chip 21 dissipates from the stage 49B as well as from the above-described heat dissipation plate 46A, and heat will be dissipated more efficiently.

The semiconductor device unit 50D shown in FIG. 28 can be formed by horizontally stacking the semiconductor devices 20K of the above structure. The left-most semiconductor device 20K is joined to the mounting board 45 using solder 47 at the third terminal parts 24b-3. Other semiconductor devices 20K are stacked by joining the neighboring first terminal parts 24b-1 and the second terminal parts 24b-2 using solder 47.

In the semiconductor device unit 50D according to the present embodiment, each semiconductor device 20K is mounted so as to stand on its side surface close to the neighboring semiconductor 20K. A space required for a single semiconductor unit 20K is reduced and the mounting density is improved.

Now, a semiconductor device 20L according to a twelfth embodiment of the present invention and a semiconductor device unit 50E according to a fifth embodiment of the present invention will be described.

Figure 29:
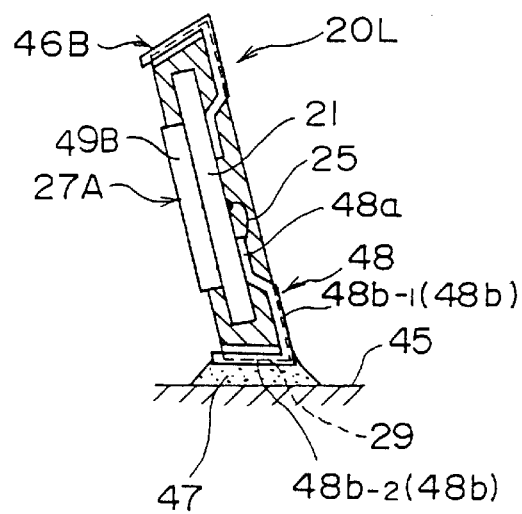
FIG. 29 is a cross-sectional diagram of a twelfth embodiment of the semiconductor device of the present invention.
Figure 30:
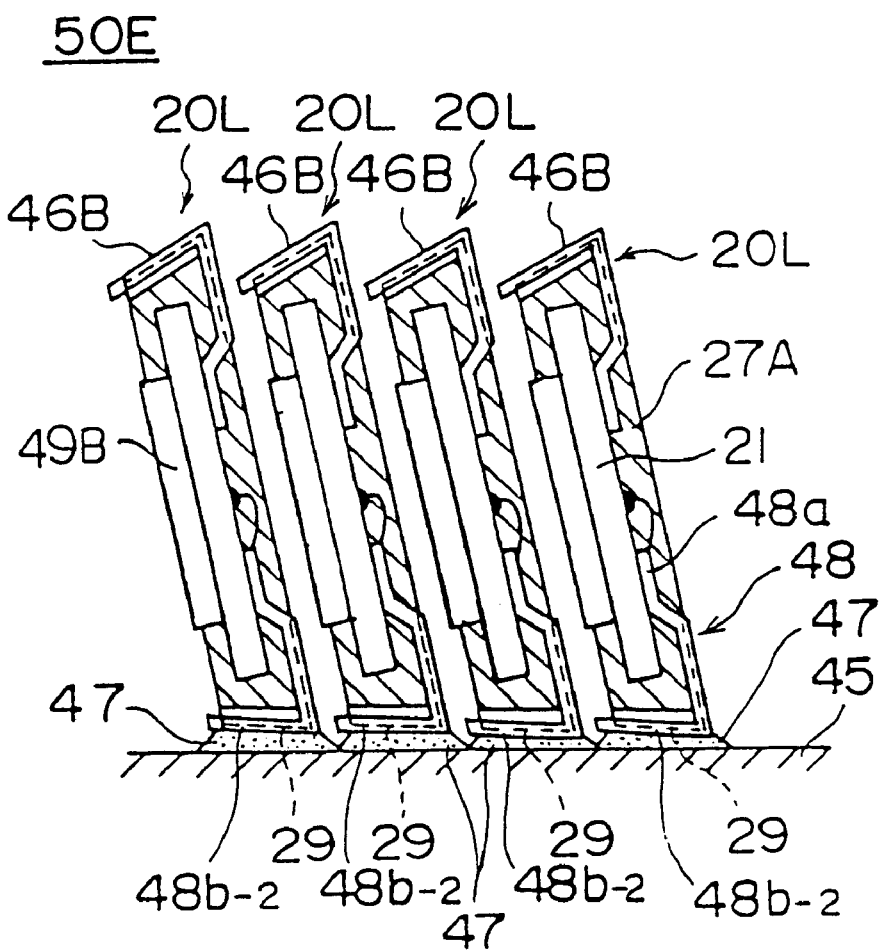
FIG. 30 is a cross-sectional diagram of a fifth embodiment of a semiconductor device unit of the present invention.

FIG. 29 is a cross-sectional diagram of the semiconductor device 20L of the twelfth embodiment of the present invention and FIG. 30 is a cross-sectional diagram of the semiconductor device unit 50E of the fifth embodiment of the present invention. In FIG. 29 and FIG. 30, components which are the same as those of FIGS. 17–19 and FIG. 21 used to describe the semiconductor device 20E and the semiconductor device unit 50C according to the third embodiment are indicated by the same reference numbers, and explanations are omitted.

The above-described semiconductor device 20E is mounted to the mounting board such that the resin package 27C is horizontal, or the first terminal parts 24b-1 are joined to the mounting board as external connection terminals. However, the semiconductor device 20L according to the present embodiment is mounted on the mounting board 45 so as to stand on its side surface.

Because of this, leads 48 serving as external connection terminals are all provided on a single side surface of the resin package 27C (the surface opposing the mounting board 45 in FIG. 29). On the side surface opposite to the side surface where the leads 48 are provided, a heat dissipation plate 46B is provided which dissipates the heat produced in the semiconductor chip 21.

Also, there are no second terminal parts 24b-2 provided on the semiconductor device 20L as were provided in each of the above-described embodiments.

Therefore, outer lead parts 48b include the first terminal parts 48b-1 provided on the bottom surface of the resin package 27A and second terminal parts 48b-2 provided on the side surface 27c of the resin package 27A.

As shown in FIG. 29, the semiconductor device 20L of the above structure is mounted on the mounting board 45 by joining the second terminal parts 48b-2 to the mounting surface 45 using solder 47. Accordingly, the semiconductor device 20L can be mounted on the mounting board 45 so as to stand on its side surface, and the place required for mounting is thus reduced.

The semiconductor device unit 50E shown in FIG. 30 can be formed by horizontally stacking the semiconductor devices 20L of the above structure. Each semiconductor device 20L is joined to the mounting board 45 using solder 47 at the second terminal parts 48b-2.

In the semiconductor device unit 50E according to the present embodiment, each semiconductor device 20L is mounted so as to stand on its side surface close to the neighboring semiconductor 20L. A space required for a single semiconductor unit 20L is reduced and the mounting density is improved.

Now, further embodiments of the semiconductor device according to the present invention will be described. It is to be noted that, although these embodiments are based on a semiconductor device having a stage, the following embodiments can be equally applied to the structures described above. The positioning mechanisms are shown as grooves formed on the resin package, but can take on any of the other forms described above. Also, for the sake of convenience, the semiconductor device of the present invention and unit thereof is illustrated in a vertically reversed manner.

Figure 31:
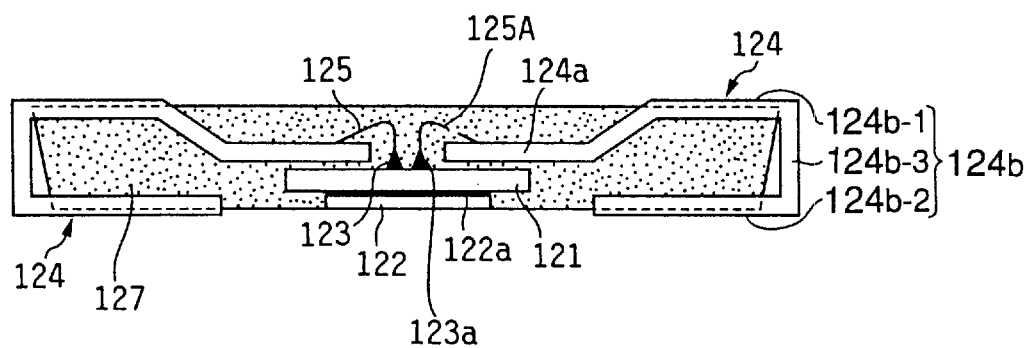
FIG. 31 is a cross-sectional diagram of a thirteenth embodiment of the semiconductor device of the present invention.

FIG. 31 is a cross-sectional diagram of a thirteenth embodiment of a semiconductor device 120A of the present invention. A semiconductor chip 121 is attached to a stage 122. The semiconductor chip 121 is provided with electrode pads 123, which are positioned at the central part of a top surface of the chip in a longitudinal direction. The electrode pads 123 also include chip-select terminals 123a.

Also, as shown in FIG. 31, the semiconductor device 120A is provided with a plurality of leads 124. As shown in the figure, inner lead parts 124a of the leads 124 and the electrode pads 123 provided on the semiconductor chip 121 are connected by means of wires 125. Also, the lead 124 includes an outer lead part 124b which is integrally formed with the inner lead part 124a. Further, the outer lead part 124b includes first to third terminal parts 124b-1 to 124b-3.

Also, as shown in FIG. 31, the semiconductor device 120A is provided with a resin package 127, in which the semiconductor chip 121, the wires 125 and the inner lead part 124a of the leads 124 are sealed and thus protected. The resin package 127 has a first surface and a second surface opposite the first surface. The lead 124 is constructed such that the outer lead part 124 is protruded out of the resin package 127 from the second surface of the resin package 127. Also, the outer lead part 124b protruding out of the resin package 127 is bent twice, so as to form the first terminal part 124b-1, the second terminal part 124b-2, and the third terminal part 124b-3.

The first terminal part 124b-1 is exposed at the second surface of the resin package 127. The second terminal part 124b-2 opposes the first surface of the resin package 127. Further, the third terminal part 124b-3 is extends vertically so as to oppose one of side surfaces of the resin package 127. That is to say, the outer lead part 124b is provided along the contour of the resin package 127.

As has been described above, according to the present embodiment, the semiconductor device 120A is provided with the first terminal part 124b-1 on the second surface of the resin package 127 while the second terminal part 124b-2 is provided on the first surface of the resin package 127. Therefore, it is possible to stack a plurality of semiconductor devices 120A in a vertical direction.

Figure 33:
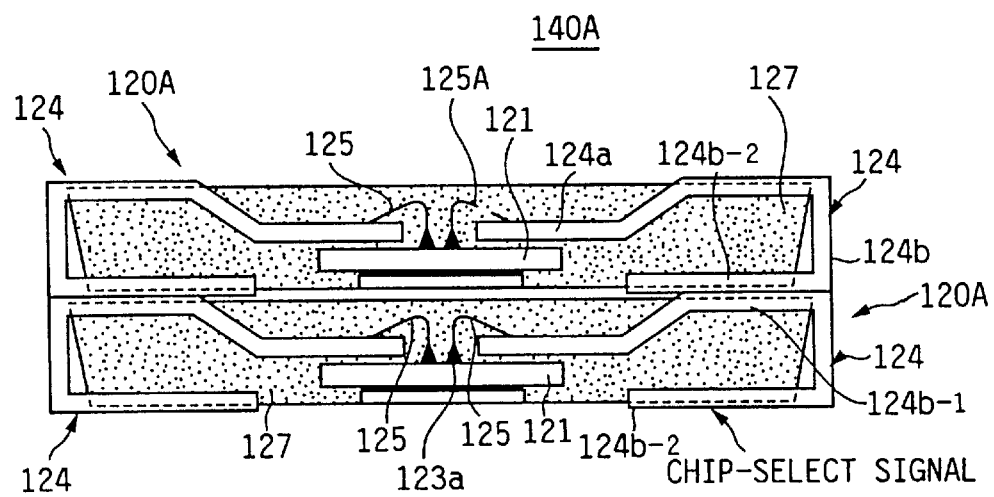
FIG. 33 is a cross-sectional diagram of a sixth embodiment of the semiconductor device unit of the present invention.
Figure 34:
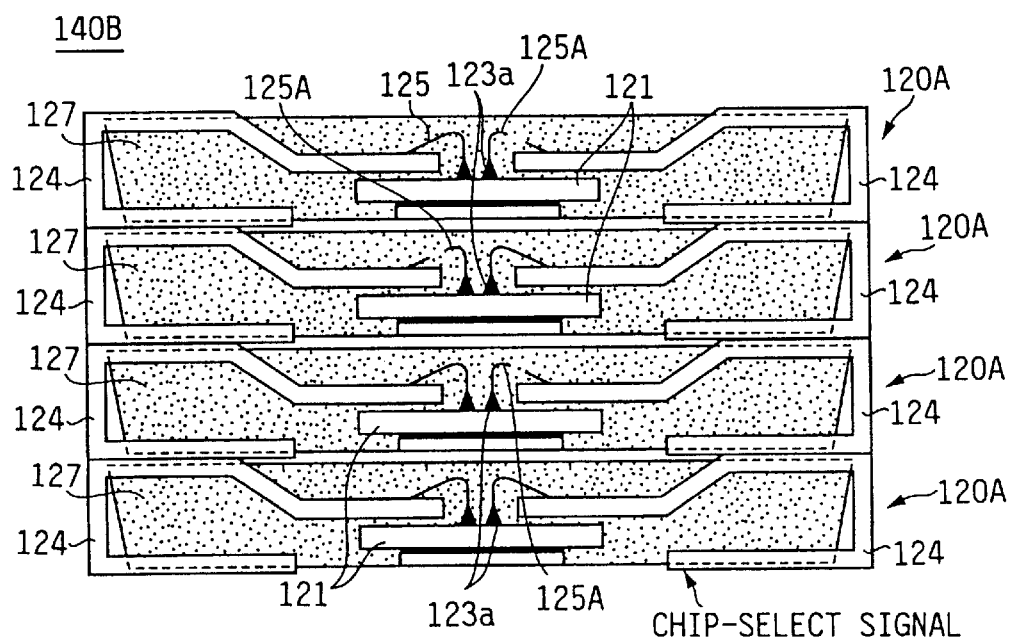
FIG. 34 is a cross-sectional diagram of a variant of the sixth embodiment of the semiconductor device unit of the present invention.

FIG. 33 is a cross-sectional diagram of a sixth embodiment of a semiconductor device unit 140A of the present invention. FIG. 34 is a cross-sectional diagram of a variant 140B of the sixth embodiment of the semiconductor device unit of the present invention 140A.

The semiconductor device unit 140A shown in FIG. 33 has a structure such that two semiconductor devices 120A of the thirteenth embodiment shown in FIG. 31 are stacked in a vertical direction. Also, the semiconductor device unit 140B shown in FIG. 34 has a structure such that four semiconductor devices 120A of the thirteenth embodiment are stacked in a vertical direction.

Therefore, when the semiconductor devices 120A are stacked, each of the semiconductor device units 140A and 140B are structured such that the second terminal parts 124b-2 of the semiconductor device 120A at an upper position are connected with the first terminal parts 124b-1 of the semiconductor device 120A at a lower position. Also, electrical and mechanical connection between the first terminals parts 124b-1 and the second terminal parts 124b can be achieved by techniques such as soldering and laser welding.

According to the above-described semiconductor device units 140A, 140B, when mounting onto the mounting board (not shown), it is possible to mount a plurality of semiconductor devices 120A on a mounting area corresponding to an area of one semiconductor device 120A. Therefore, an improved mounting efficiency is achieved.

Now, the wires 125 of the semiconductor device 120A will be described in detail. Among the plurality of wires 125 provided in the semiconductor device 120A, predetermined wires 125 (hereinafter referred to as disconnected wires 125A) are cut. Thus with such disconnected wires 125A, the semiconductor chip 121 and the lead 124 are electrically disconnected.

Therefore, when the semiconductor devices 120A having such disconnected wires 125A are stacked, the lead 124 connected with the disconnected wire 125A will only serve as an interconnection electrically connecting the upper and lower semiconductor devices 120A (or the mounting board.) Thus, when stacking the plurality of semiconductor devices 120A, it is possible to supply signals to a desired electrode pad 23 on the semiconductor device 121 via respective leads 124 vertically connected by appropriately selecting the placement of the disconnected wires 125A.

In the following, this will be described in detail. The disconnected wires 125A are formed by cutting the wires connected to the chip-select terminals 123a of the semiconductor chip 121. Then, when the plurality of semiconductor devices 120A are stacked, it is possible to selectively operate the desired semiconductor device 120A (semiconductor chip 121).

For example, in the case of the semiconductor device unit 140A shown in FIG. 33, when a chip-select signal is supplied to the second terminal part 124b-2 of the semiconductor device 120A at the lower position, only the semiconductor device 120A at the lower position will operate. Also, in the case of the semiconductor device unit 140B shown in FIG. 34, when a chip-select signal is supplied to the second terminal part 124b-2 of the semiconductor device 120A at the lowermost position, the semiconductor device 120A at the lowermost position and one of the semiconductor devices 120A above the lowermost semiconductor devices 120A will operate.

Thus, by appropriately selecting the placement of the disconnected wires 125A, it is possible to achieve a structure for selectively operating the desired semiconductor device 120A of the semiconductor units 140A, 140B.

Figure 39:
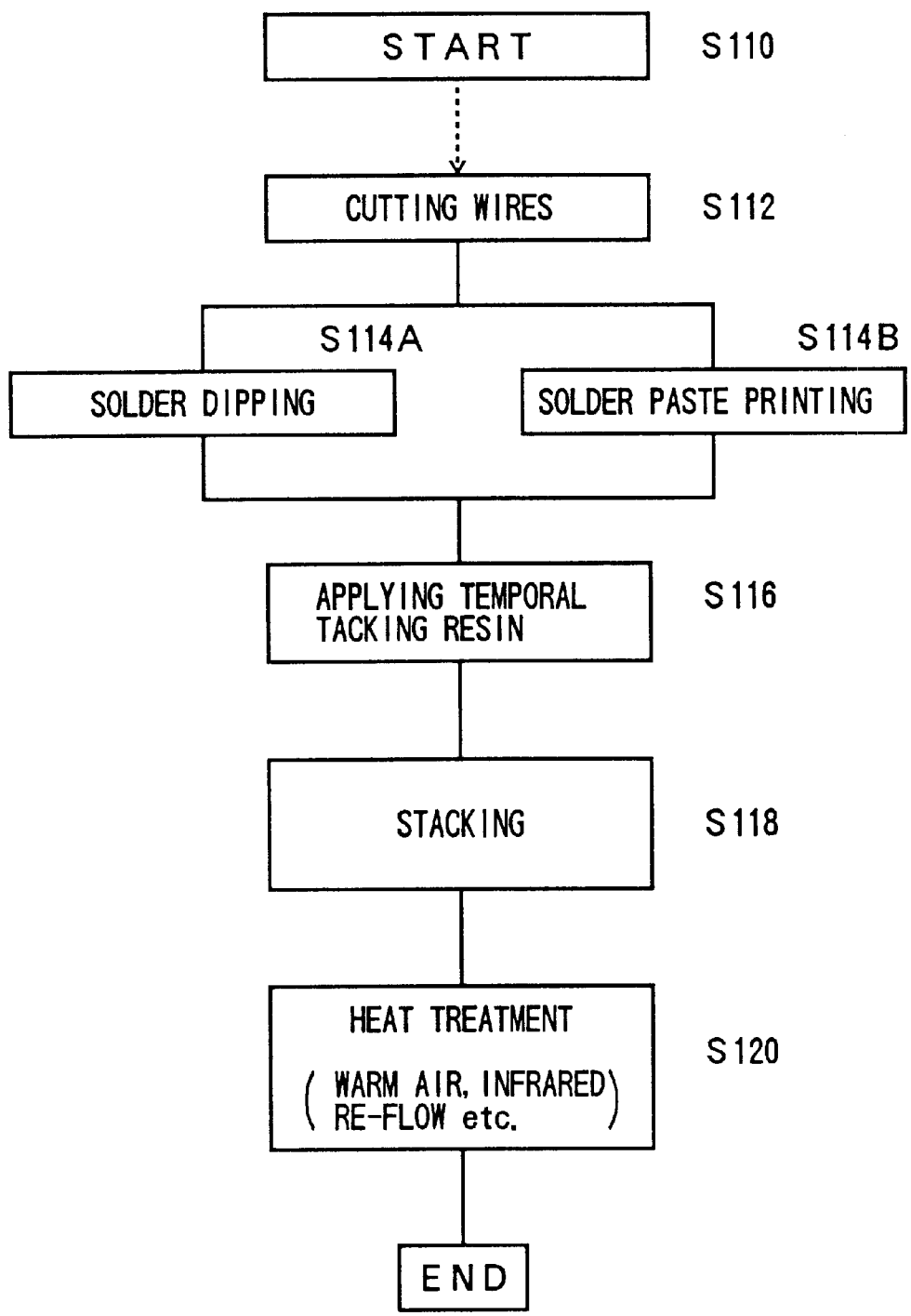
FIG. 39 is a flowchart showing a method of manufacturing the semiconductor device unit of the present invention.

Referring to FIG. 39, a method of manufacturing the semiconductor device unit 140A, 140B of the above-described structure will be described. FIG. 39 is a flowchart showing a method of manufacturing the semiconductor device unit 140A, 140B of the present invention. In the figure, the steps are indicated by "S".

In order to manufacture the semiconductor device unit 140A, 140B, first of all, in step 110 (S110) the semiconductor device 120A is manufactured, which semiconductor device 120A is not provided with the disconnected wires 125A. In other words, the wires 125 have not been cut. The semiconductor devices 120A thus-manufactured have identical structures, whereas in the prior art, the semiconductor devices have different structures since the structures of the wires connecting the chip selecting leads and the electrode pads are different. Also, the semiconductor device 120A without any disconnected wires 125A can be manufactured by any of the well-known semiconductor device manufacturing processes, so that the description thereof is omitted in the present specification.

Figure 32:
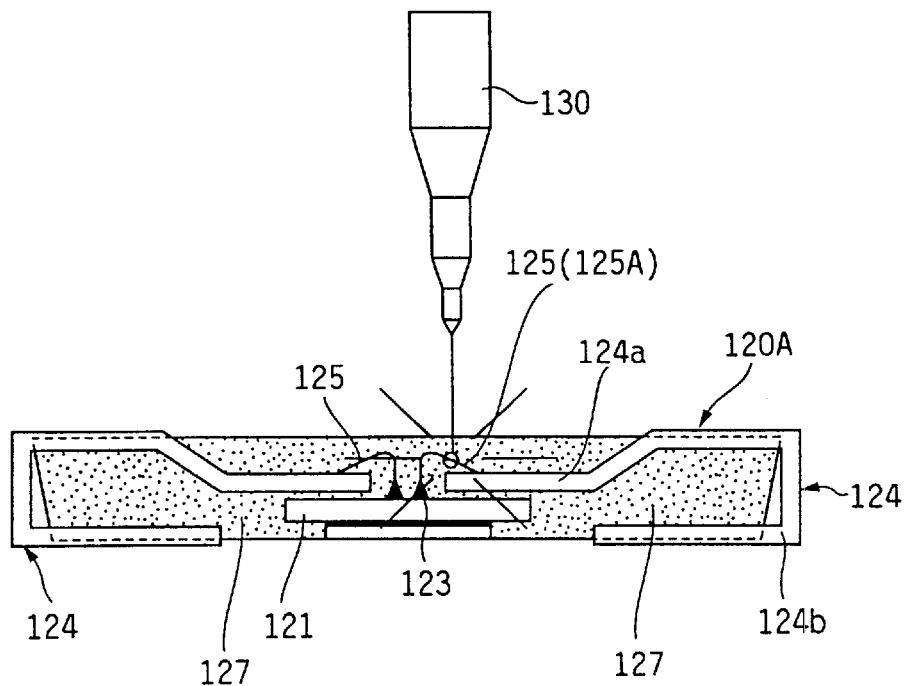
FIG. 32 is a schematic diagram showing a method of manufacturing the thirteenth embodiment of the semiconductor device of the present invention, particularly showing a cutting step.

In order to manufacture the semiconductor device unit 140A, 140B by stacking the semiconductor devices 120A, the predetermined wires 125 are cut (S112). In the present embodiment, as shown in FIG. 32, a laser device 130 is used as means of cutting the wires 125. The predetermined wire 125 is irradiated by a laser beam using the laser device 130, the wire 125 being cut so as to form the disconnected wire 125A.

Thus by using the laser device 130 as the cutting means, the wires 125 can simply be cut by the irradiation of the laser beam. Therefore, it is possible to facilitate the cutting process of the leads 124 of the manufactured semiconductor device 120A.

The laser device 130 used in the cutting step can be one of a gas laser ($CO_2$ laser, etc.), a solid stage laser (ruby laser, neodymium laser, etc.), a liquid laser (YAG laser, glass laser, etc.), a semiconductor laser, and a chemical laser (X-ray laser, etc.).

Also, all types of lasers described above are capable of adjusting the wavelength (i.e., energy) of the laser beam. Therefore, by appropriately selecting the wavelength of the laser beam, only the leads 124 can be cut while preventing the resin package 127 from being damaged. Thus, by implementing the cutting step, a degradation of a sealing ability of the resin package 127 can be prevented.

After the cutting step, the method proceeds either to a solder dipping step (S114A) or to a solder paste printing step(S114B). The steps S114A and S114B are a joining material providing step in which the solder serving as a joining material is provided on the first or second terminal parts 112b-1, 112b-2 of the semiconductor device 120A.

After the joining material providing step, temporal tacking resin is applied in step S116. Then, a plurality of semiconductor devices 120A provided with solder is stacked in a stacking step (S118). After the stacking step, a heat treatment (warm air, infrared re-flow, etc.) is implemented in step S120, so that the solder is fused. Thus, the semiconductor devices 120A adjacent to each other in the vertical direction are electrically and mechanically connected (joining step).

By implementing the above-described steps, the semiconductor device unit 140A,140B is manufactured. Also, in the embodiment described above, solder is used as a joining material, but it also possible to use another joining material. Further, the first and second terminal parts 124b-1, 124b-2 may be directly joined using the laser device.

According to the above-described method of manufacturing the semiconductor device unit 140A, 140B, in the cutting step, a cutting process of the leads 124 is implemented on the completed semiconductor device 120A by mean of the laser device 130. Therefore, in the semiconductor device manufacturing step S110, identical semiconductor devices 120A are manufactured. Then, by implementing a cutting step S112, respective ones of the semiconductor devices 120A will be configured as structures capable of being stacked.

Accordingly, in the semiconductor device manufacturing step S110, it is not necessary to individually manufacture the semiconductor device 120A to be stacked. Thus, the manufacturing step can be simplified. Also, in regard to a product management of the semiconductor devices 120A after completion of the manufacturing process of the semiconductor devices 120A and before implementing the cutting process, it is not necessary to individually manage the semiconductor devices 120A to be managed since the semiconductor devices 120A are identical. Thus, the product management can be simplified.

In the following, a fourteenth embodiment of a semiconductor device of the present invention will be described.

Figure 35:
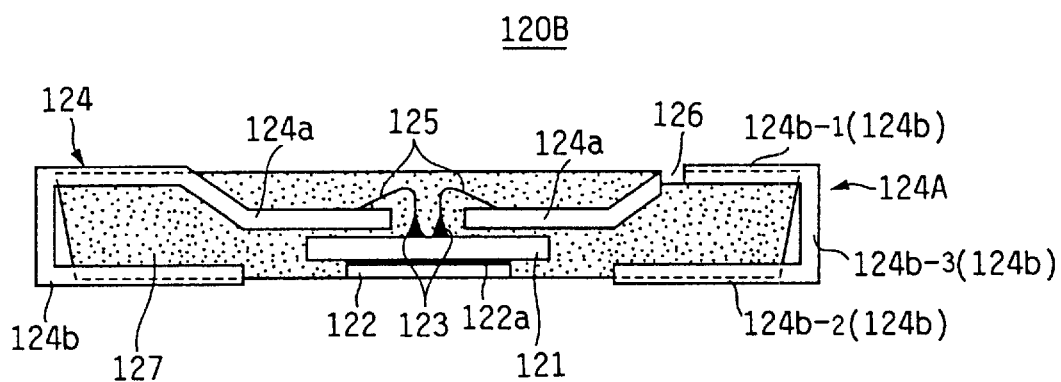
FIG. 35 is a cross-sectional diagram of a fourteenth embodiment of the semiconductor device of the present invention.

FIG. 35 is a cross-sectional diagram of the fourteenth embodiment of a semiconductor device 120B of the present invention. In FIG. 35, components having the same structures as the components of the semiconductor device 120A according to the twelfth embodiment shown in FIG. 31 will be represented by the same reference numerals and will not be described in detail.

The semiconductor device 120A of the thirteenth embodiment is provided with disconnected wires 125A formed by cutting the predetermined wires 125, so as to enable a selective operation of a desired semiconductor chip 121. The semiconductor device 120B the fourteenth embodiment is provided with leads 124 having disconnected portions 126. The disconnected portion 126 serves to disconnect an electrical connection between the external terminal parts of the leads 124 (i.e., the first and second terminal parts 124b-1, 124b-2) and the semiconductor chip 121.

Hereinafter, the lead 124 provided with the disconnected portion 126 will be referred as the disconnected lead 124A.

Figure 36:
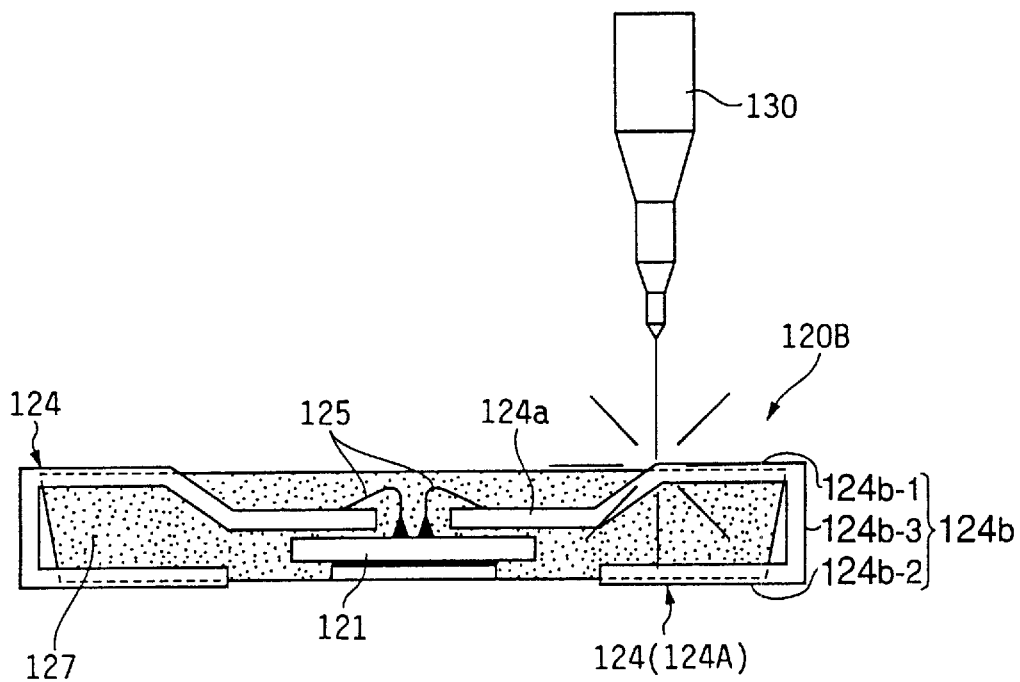
FIG. 36 is a schematic diagram showing a method of manufacturing the fourteenth embodiment of the semiconductor device of the present invention, particularly showing a cutting step.

As shown in FIG. 36, the disconnected portion 126 is formed by cutting the lead 124 using the laser device 130. The disconnected portion 126 is formed at a position at a boundary of the first terminal part 124b-1 of the outer lead part 124b and the inner lead part 124a. Thus, when a plurality of the semiconductor devices 120B are stacked, the disconnected portions 126 are prevented from being short-circuited with the second terminal part 124b-2 of the semiconductor device stacked on top of the semiconductor device 120B in consideration.

Figure 37:
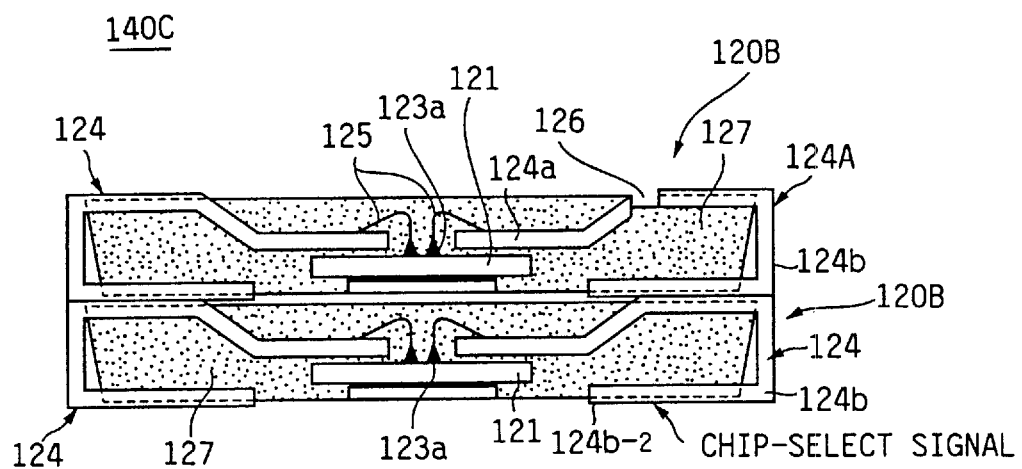
FIG. 37 is a cross-sectional diagram of a seventh embodiment of the semiconductor device unit of the present invention.
Figure 38:
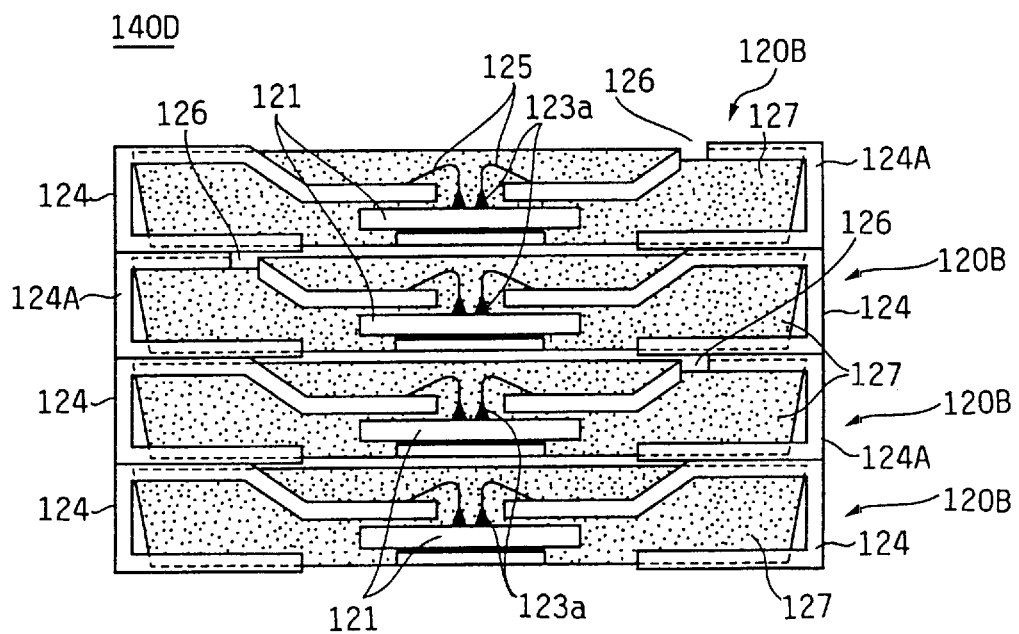
FIG. 38 is a cross-sectional diagram of a variant of the seventh embodiment of the semiconductor device unit of the present invention.

FIG. 37 is a cross-sectional diagram of a seventh embodiment of a semiconductor device unit 140C of the present invention. FIG. 38 is a cross-sectional diagram of a variant 140D of the seventh embodiment of the semiconductor device unit 140C of the present invention.

The semiconductor device unit 140C shown in FIG. 37 has a structure such that two semiconductor devices 120B of the fourteenth embodiment shown in FIG. 35 are stacked in a vertical direction. Also, the semiconductor device unit 140D shown in FIG. 38 has a structure such that four semiconductor devices 120B of the fourteenth embodiment are stacked in a vertical direction.

The positions of the disconnected portions 126 correspond to the positions of the disconnected wires 125A of the semiconductor device units 140A, 140B shown in FIGS. 33 and 34. Therefore,the semiconductor device units 140C, 140D shown in FIGS. 37 and 38 will be operated in an identical manner to the manner in which the semiconductor device units 140A, 140B shown in FIGS. 33 and 34 are operated. Thus, also with the semiconductor device units 140C, 140D of the present embodiment, among the plurality of semiconductor devices 120B stacked vertically, it is possible to selectively operate the desired semiconductor device 120B (semiconductor chip 121).

The above-described embodiments can be implemented by providing the disconnected wire 125A and the disconnected portion 126 for a plurality of leads 124 of one of the semiconductor devices 120A, 120B.

Also, in the embodiments described above, the lead 124, to which the chip-select signals are supplied, is provided with the disconnected wire 125A and the disconnected portion 126. However, the disconnected wire 125A and the disconnected portion part 126 may be provided on the leads which are supplied with other signals or leads used as a power source or ground.

Further, the present invention is not limited to these embodiments, but variations and modifications may be made without departing from the scope of the present invention.

The present application is based on Japanese priority application No. 9-182827 filed on Jul. 8, 1997 and No. 10-209732 filed on Jul. 24, 1998, the entire contents of which are hereby incorporated by reference.

What is claimed is:

1. A semiconductor device comprising:

a resin package having a first surface and a second surface opposite to said first surface;

a plurality of leads having inner lead parts connected to said semiconductor chip and outer lead parts extending from said second surface, said outer lead parts being bent along said resin package so as to form first terminal parts on said second surface and second terminal parts on said first surface;

connection means electrically connecting and semiconductor chip and said leads; and a positioning mechanism positioning said second terminal parts at predetermined positions on said first surface of said resin package, wherein said positioning mechanism comprises protrusions formed on said second terminal parts and recessed parts formed on said first surface of said resin package.

2. A semiconductor device comprising:

a resin package having a first surface and a second surface opposite to said first surface;

a plurality of leads having inner lead parts connected to said semiconductor chip and outer lead parts extending from said second surface, said outer lead parts being bent along said resin package so as to form first terminal parts on said second surface and second terminal parts on said first surface;

connection means electrically connecting and semiconductor chip and said leads; and a positioning mechanism positioning said second terminal parts at predetermined positions on said first surface of said resin package, wherein dimensions of said positioning mechanism are greater than dimensions of each of said outer lead parts as to accommodate said outer lead parts.

3. A semiconductor device unit having a structure in which a plurality of semiconductor devices are stacked, each of said semiconductor devices comprising:

a resin package in which a semiconductor chip is sealed, said resin package having a first surface and a second surface opposite to said first surface;

a plurality of leads having inner lead parts connected to said semiconductor chip and outer lead parts extending from said second surface, said outer lead parts being bent along the shape of said resin package so as to form first terminal parts on said second surface and second terminal parts on said first surface;

connection means electrically connecting said semiconductor chip and said leads; and a positioning mechanism positions said second terminal parts at predetermined positions on said first surface of said resin package, wherein neighboring semiconductor devices are joined in such a manner that the first terminal parts of one of the neighboring semiconductor devices are in contact with the second terminal parts of another one of the neighboring semiconductor devices, wherein said positioning mechanism comprises protrusions formed on said second terminal parts and recessed parts formed on said first surface of said resin package.

4. A semiconductor device unit having a structure in which a plurality of semiconductor devices are stacked, each of said semiconductor devices comprising:

a resin package in which a semiconductor chip is sealed, said resin package having a first surface and a second surface opposite to said first surface;

a plurality of leads having inner lead parts connected to said semiconductor chip and outer lead parts extending from said second surface, said outer lead parts being bent along the shape of said resin package so as to form first terminal parts on said second surface and second terminal parts on said first surface;

connection means electrically connecting said semiconductor chip and said leads; and a positioning mechanism positions said second terminal parts at predetermined positions on said first surface of said resin package, wherein neighboring semiconductor devices are joined in such a manner that the first terminal parts of one of the neighboring semiconductor devices are in contact with the second terminal parts of another one of the neighboring semiconductor devices, wherein dimensions of said positioning mechanism are greater than dimensions of each of said outer lead parts so as to accommodate said outer lead parts.

* * * * *